United States Patent
Chavali et al.

(10) Patent No.: US 11,393,762 B2
(45) Date of Patent: Jul. 19, 2022

(54) FORMATION OF TALL METAL PILLARS USING MULTIPLE PHOTORESIST LAYERS

(71) Applicant: INTEL CORPORATION, Santa Clara, CA (US)

(72) Inventors: Sri Chaitra J. Chavali, Chandler, AZ (US); Liwei Cheng, Chandler, AZ (US); Siddharth K. Alur, Chandler, AZ (US); Sheng Li, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/473,599

(22) PCT Filed: Mar. 30, 2017

(86) PCT No.: PCT/US2017/024999
§ 371 (c)(1),
(2) Date: Jun. 25, 2019

(87) PCT Pub. No.: WO2018/182613
PCT Pub. Date: Oct. 4, 2018

(65) Prior Publication Data
US 2019/0326222 A1    Oct. 24, 2019

(51) Int. Cl.
*H01L 23/538*    (2006.01)
*H01L 21/027*    (2006.01)
(Continued)

(52) U.S. Cl.
CPC ...... *H01L 23/5384* (2013.01); *H01L 21/0273* (2013.01); *H01L 21/486* (2013.01);
(Continued)

(58) Field of Classification Search
CPC ............. H01L 23/5384; H01L 21/0273; H01L 21/486; H01L 23/49866; H01L 23/5386;
(Continued)

(56) References Cited

U.S. PATENT DOCUMENTS

2002/0149118 A1    10/2002    Yamaguchi et al.
2002/0187638 A1*   12/2002    Nakagawa ........ H01L 21/31058
                                                                    438/689
(Continued)

FOREIGN PATENT DOCUMENTS

JP    2014093324    5/2014

OTHER PUBLICATIONS

International Search Report and Written Opinion for International Patent Application No. PCT/US17/24999, dated Nov. 30, 2017.
International Preliminary Report on Patentability for PCT Application No. PCT/US17/24999, dated Oct. 10, 2019.

*Primary Examiner* — Thanh Y. Tran
(74) *Attorney, Agent, or Firm* — Essential Patents Group, LLP.

(57) ABSTRACT

An apparatus system is provided which comprises: a substrate; a metal pillar formed on the substrate, the metal pillar comprising a first section and a second section, wherein the first section of the metal pillar is formed by depositing metal in a first opening of a first photoresist layer, and wherein the second section of the metal pillar is formed by depositing metal in a second opening of a second photoresist layer.

19 Claims, 14 Drawing Sheets

(51) Int. Cl.
  *H01L 21/48* (2006.01)
  *H01L 23/498* (2006.01)
  *H01L 25/18* (2006.01)
(52) U.S. Cl.
  CPC .... *H01L 23/49866* (2013.01); *H01L 23/5386* (2013.01); *H01L 23/5389* (2013.01); *H01L 25/18* (2013.01)
(58) Field of Classification Search
  CPC ................ H01L 23/5389; H01L 25/18; H01L 21/76811; H01L 21/76885; H01L 21/7681; H01L 21/285–2885; H01L 2225/1058; H01L 24/16; H01L 24/32; H01L 24/48; H01L 2224/0401; H01L 2224/48235; H01L 2224/73253; C23C 14/14–205; C23C 16/06–20
  See application file for complete search history.

(56) References Cited

U.S. PATENT DOCUMENTS

| | | | |
|---|---|---|---|
| 2005/0101122 A1* | 5/2005 | Hwang | H01L 21/76885 438/636 |
| 2005/0224991 A1 | 10/2005 | Yeo | |
| 2009/0020322 A1* | 1/2009 | Hsu | H01L 23/498 174/257 |
| 2012/0153460 A1 | 6/2012 | Chi | |
| 2012/0186867 A1* | 7/2012 | Asai | H05K 3/0038 174/262 |
| 2015/0187746 A1 | 7/2015 | Hsu et al. | |
| 2016/0099215 A1* | 4/2016 | Toda | H01L 23/293 257/774 |
| 2016/0133555 A1* | 5/2016 | Nakamura | H05K 3/427 257/774 |
| 2017/0256478 A1* | 9/2017 | Sakamoto | H01L 21/6835 |

* cited by examiner

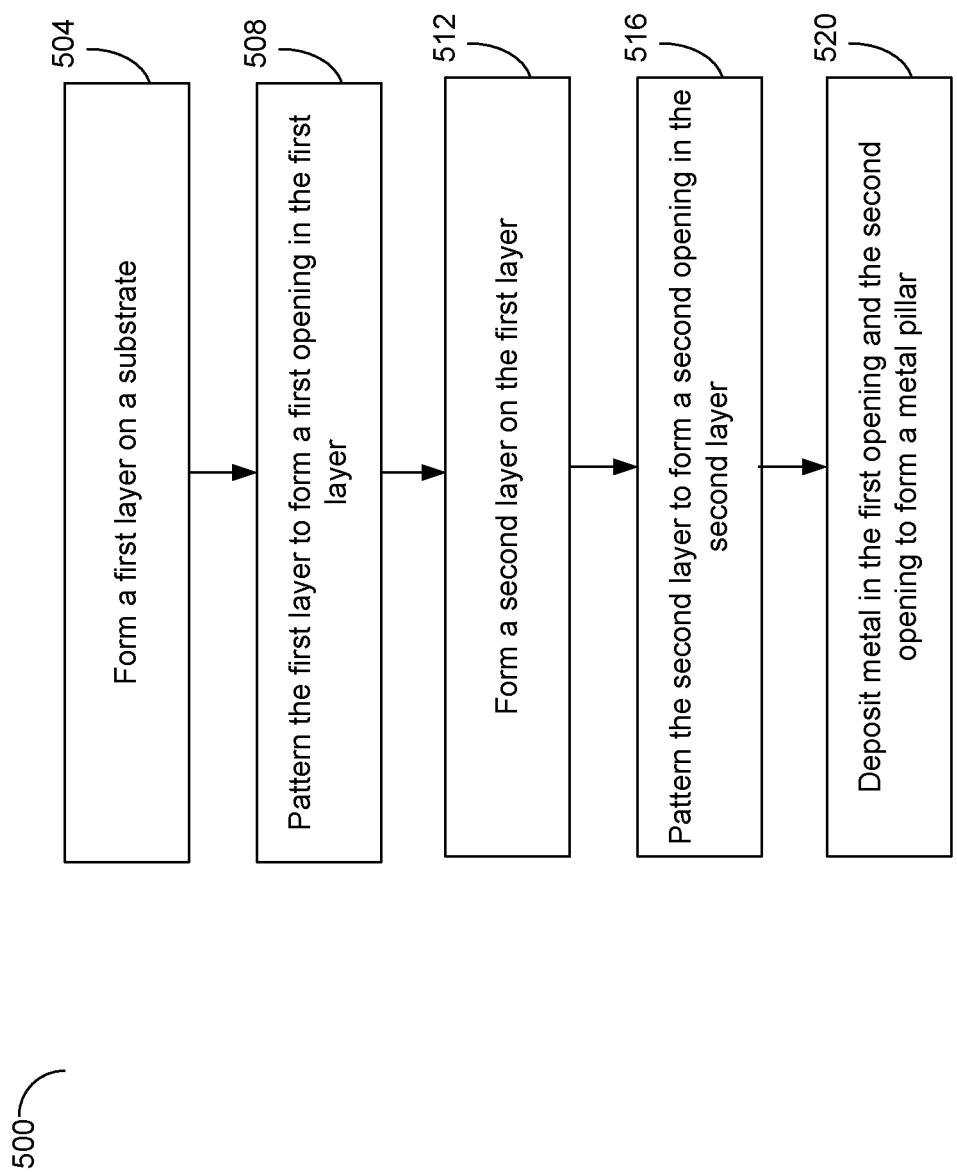

FORMATION OF TALL METAL PILLARS USING MULTIPLE PHOTORESIST LAYERS

CLAIM OF PRIORITY

This Application is a National Stage Entry of, and claims priority to, PCT Application No. PCT/US17/24999, filed on Mar. 30, 2017 and titled "FORMATION OF TALL METAL PILLARS USING MULTIPLE PHOTORESIST LAYERS," which is incorporated by reference in its entirety for all purposes.

BACKGROUND

Often times, metal pillars (e.g., copper pillars) or metal posts are used to interconnect two packages in a package-on-package (POP) structure, or connect two components within a package. For some applications, it may be desirable to form relatively high or tall metal pillars. However, as the height of the metal pillars are increased, conventional systems may form metal pillars that may have relatively large diameter and relatively large pitch. For example, in a conventional system, a typical aspect ratio (e.g., ratio of a diameter and a height) of a metal pillar may be about 1:1. Thus, taller metal pillars formed using a conventional system may also tend to have relatively larger diameter. Conventional systems may not be able to form relatively tall metal pillars with relatively small diameter and relatively small pitch.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 5 illustrates a flowchart depicting a method for forming a metal pillar, according to some embodiments.

DETAILED DESCRIPTION

Figure 1A:
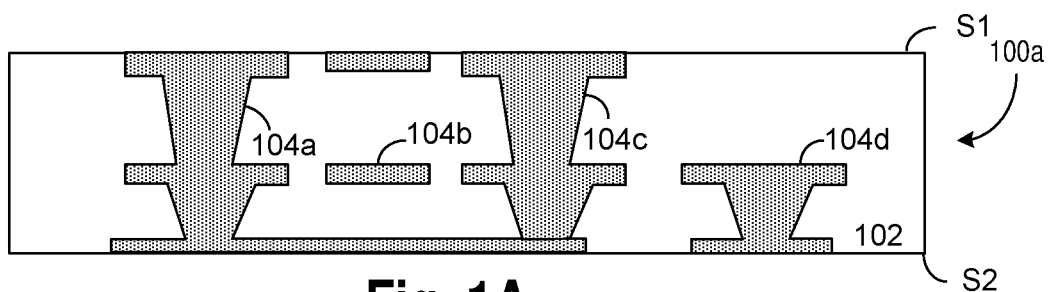
FIGS. 1A-1K schematically illustrate various operations associated with formation of a plurality of metal pillars on a substrate, according to some embodiments.

In some embodiments, metal pillars (e.g., copper pillars or copper posts) may be used in a semiconductor package for various purposes. For example, metal pillars can provide connectivity between various components of a semiconductor package, provide connectivity between two semiconductor packages in a POP structure, etc.

In some embodiments, a metal pillar may be formed by forming two layers laminated on top of each other. For example, a first layer may be initially formed on a substrate (e.g., on which the metal pillar is to be formed), and a first opening may be formed in the first layer. A second layer may be formed on the first layer, and a second opening may be formed in the second layer. In some embodiments, the second opening may be aligned above the first opening. The first opening and the second opening may be filed or plated with metal. Subsequently, the first and second layers may be removed or peeled (e.g., with the metal within the first and second openings not being removed), thereby forming the metal pillar. In some embodiments, the first and second layers may be photoresist layers, e.g., dry film resist (DRF) layers, and the first and second openings may be done via lithographic exposure of the first and second DFR layers.

There are many technical effects of the various embodiments. For example, assume that a metal pillar formed based on the teaching of this disclosure is relatively tall (e.g., has a relatively large height). A conventional system may use a single layer to form a metal pillar. However, for a relatively tall metal pillar, the single layer may have to be relatively thicker in the conventional system. But to create an opening in the relatively thicker layer, a diameter of the opening may get relatively large. Accordingly, it may not be possible to form tall metal pillars having relatively smaller diameter using a single layer. In contrast, in the embodiments discussed herein, even if the metal pillar is relatively tall (e.g., having a height of h), individual layers of the first and second layers may have a thickness that is about half the height h of the metal pillar. Accordingly, the diameter of the openings in the two layers can be made relatively small, thereby resulting in relatively smaller diameter of the metal pillar. Such a smaller diameter of the metal pillar, however, may not be achievable using a single layer. Also, reducing the diameter of the metal pillar may result in a smaller pitch for metal pillars, and thus, smaller pitch for interconnect structures of a POP component, thereby reducing a x-y dimension of the POP component. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on." The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "back," "top," "bottom," "over," "under," and the like in the description and in the claims, if any, are used for descriptive purposes and not necessarily for describing permanent relative positions.

FIGS. 1A-1K schematically illustrate various operations associated with formation of a plurality of metal pillars (also referred to herein as metal posts) on a substrate, according to some embodiments. Referring to FIG. 1A, this figure illustrates a component 100a comprising a substrate 102. A top surface and a bottom surface of the substrate 102 are respectively labeled as S1 and S2 in FIG. 1A. A cross-sectional view of the substrate 102 is illustrated in FIG. 1A. In an example, only a portion of the cross-sectional view of the substrate 102 is illustrated in FIG. 1A.

In some embodiments, the substrate 102 may be any appropriate substrate, e.g., a Printed Circuit Board (PCB) composed of an electrically insulating material such as an epoxy laminate, or another appropriate type of substrate. For example, the substrate 102 may include electrically insulating layers composed of materials such as, phenolic cotton paper materials (e.g., FR-1), cotton paper and epoxy materials (e.g., FR-3), woven glass materials that are laminated together using an epoxy resin (FR-4), glass/paper with epoxy resin (e.g., CEM-1), glass composite with epoxy resin, woven glass cloth with polytetrafluoroethylene (e.g., PTFE CCL), or other polytetrafluoroethylene-based prepreg material.

In some embodiments, the substrate 102 may comprise a plurality of interconnect components 104a, 104b, 104c, 104d, etc. (referred to generally as interconnect components 104). Merely as an example, individual ones of the interconnect components 104 may comprise traces, trenches, routing layers, ground planes, power planes, re-distribution layers (RDLs), and/or any other appropriate electrical routing features. Although a specific pattern and a specific number of the interconnect components 104 are illustrated in FIG. 1A, such a pattern and/or a number are merely examples. In some embodiments, the interconnect components 104 comprise conductive material, e.g., metal.

Figure 1B:
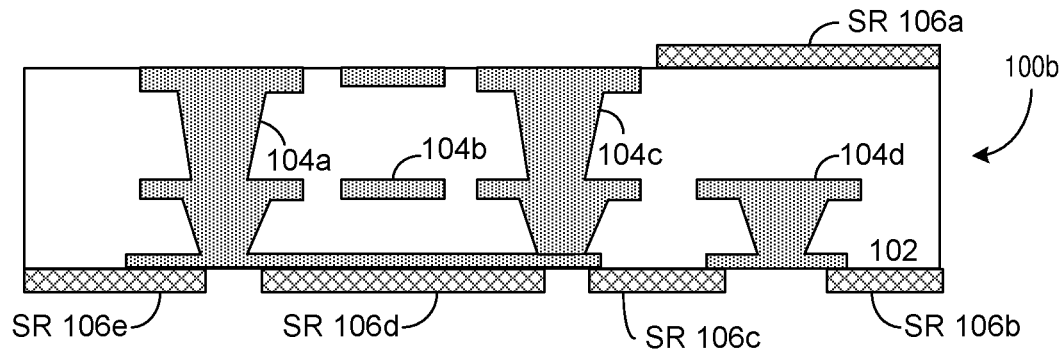

FIG. 1B illustrates a component 100b, in which example solder resist (SR) material 106a, 106e are formed on the surfaces of the substrate 102 of FIG. 1A. Although FIG. 1B illustrates specific number and locations of the SR material 106, such number and locations are merely examples, and does not limit the teachings of this disclosure. In some embodiments, the SR material may be solder mask or solder stop mask, which may comprise, for example, polymer or another appropriate material applied for protection against oxidation and to prevent solder bridges from forming between closely spaced solder pads. In an example, the SR materials 106e and 106d may define an opening in a bottom surface of the interconnect component 104a. Similarly, in an example, the SR materials 106d and 106c may define an opening in a bottom surface of the interconnect component 104c, and the SR materials 106c and 106b may define an opening in a bottom surface of the interconnect component 104d.

Figure 1C:
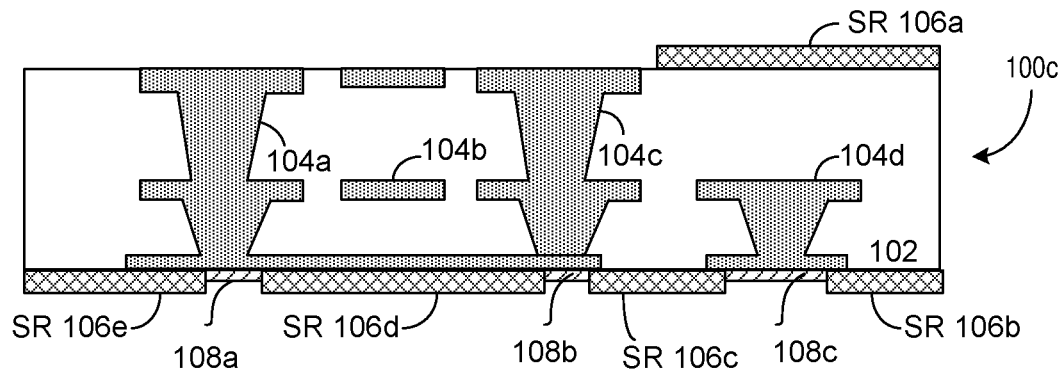

FIG. 1C illustrates a component 100c, in which layers 108a, 108b, and 108c (referred to generally as "layers 108") are formed on the openings in the bottom surfaces of the interconnect components 104a, 104c, and 104d, respectively, of the component 100b of FIG. 1B. In an example, the layers 108 comprise nickel, palladium and/or gold (NiPdAu), although in other example, one or more additional material may also be included in the layers 108. The layers 108, for example, may be formed for proper surface finish of the exposed bottom surfaces (e.g., exposed through the SR 106) of the interconnect components 104.

Figure 1D:
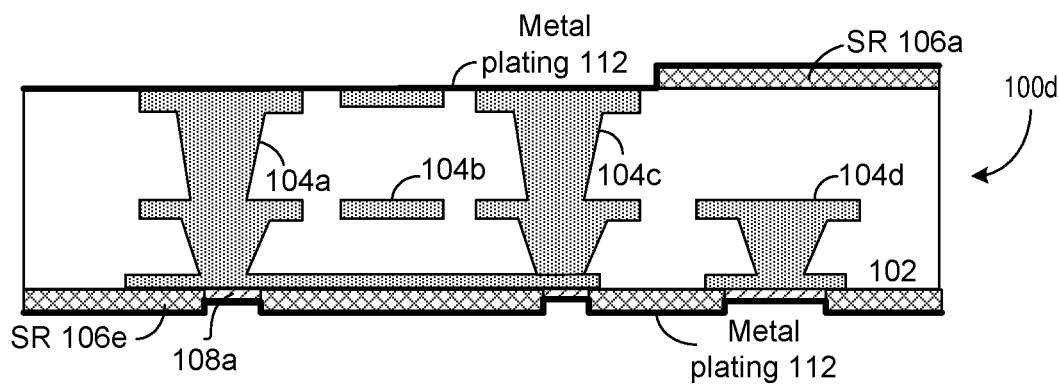

FIG. 1D illustrates a component 100d, in which metal plating 112 (illustrated as a thick line in the figures) is formed on the top and bottom surfaces of the component 100c of FIG. 1C. The metal plating 112, for example, may be copper plating. In some embodiments, the metal plating 112 may be formed by an electro-less (E-less) copper plating process on the surfaces of the component 100c, although the metal plating 112 can be formed by another appropriate manner as well. In an example, the metal plating 112 may provide appropriate metal plated surfaces for formation of metal pillars (e.g., which are illustrated in subsequent figures).

Figure 1E:
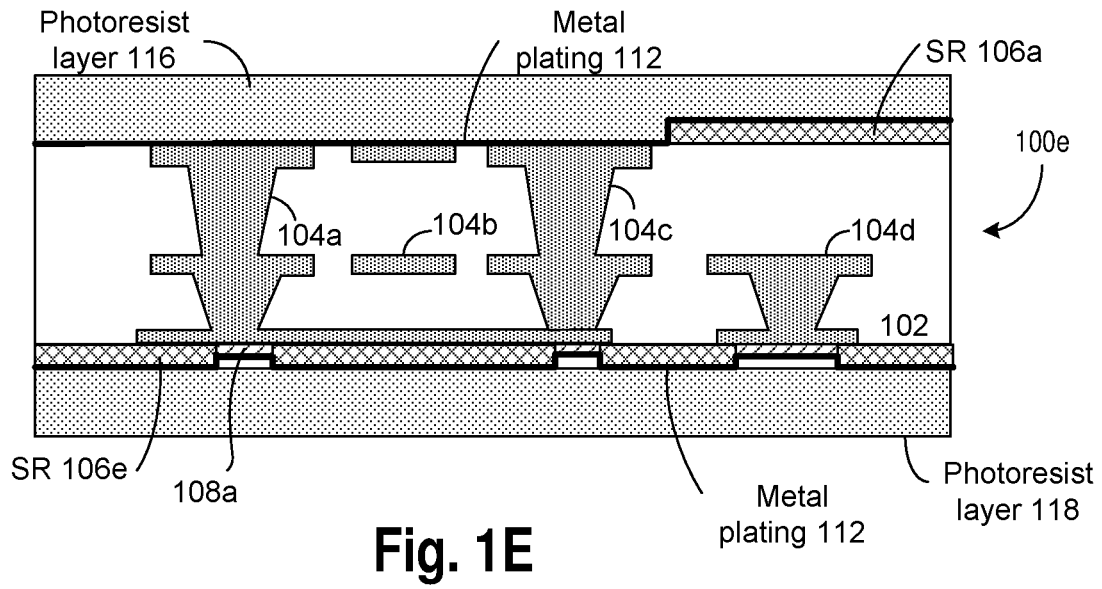

FIG. 1E illustrates a component 100e, in which, in some embodiments, photoresist layers 116 and 118 may be applied respectively to the top and bottom surfaces of the component 100d of FIG. 1D. However, in some other embodiments (and although not illustrated in FIG. 1E), the photoresist layer 116 may be applied to the top surface of the component 100e, but no photoresist layer may be applied to the bottom surface of the component 100e (e.g., the photoresist layer 118 may be absent in such embodiments).

The photoresist layers 116, 118 may be of any appropriate type and thickness. In an example, the photoresist layers 116 and/or 118 may be dry film resist (DFR) material. Merely as an example, an appropriate thick resist layer of series HM-4000® manufactured by Hitachi Chemical™ may be used as the photoresist layers 116 and/or 118, although in other examples, any other appropriate type of DFR or other photoresist material may be used for the photoresist layers 116 and/or 118. In some embodiments, if the metal pillars to be eventually formed on the substrate 102 (e.g., as discussed herein in subsequent figures) have a height of about h, then a thickness of the photoresist layer 116 may be about h/2.

Figure 1F:
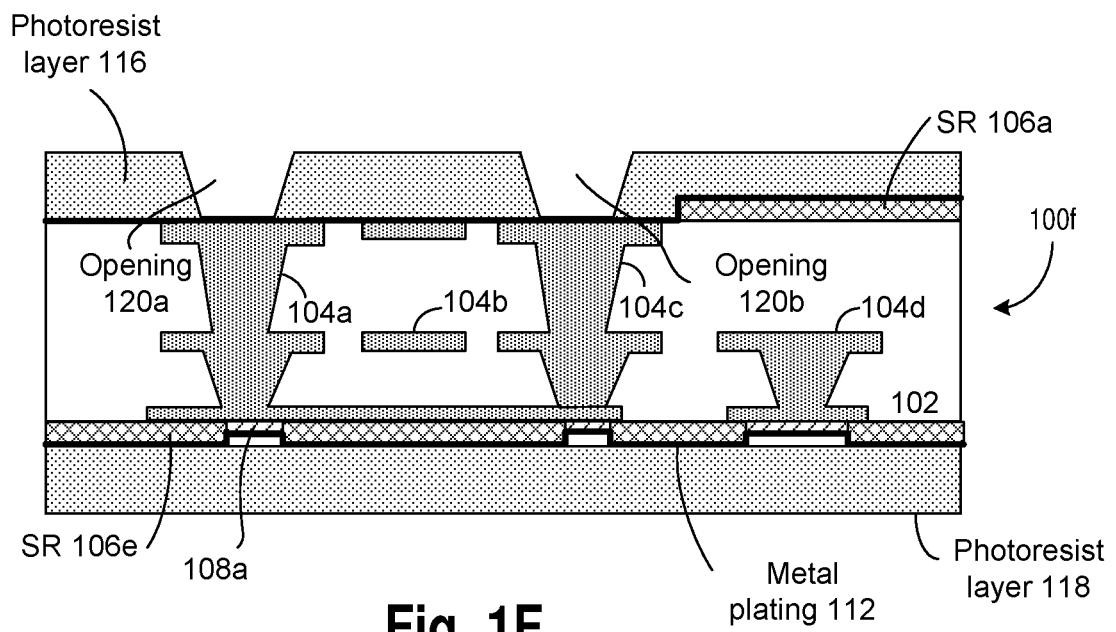

In FIG. 1F, the photoresist layer 116 may be patterned to form openings 120a and 120b, thereby forming a component 100f. In some embodiments, the opening 120a may be formed over the top surface of the interconnect component 104a, and the opening 120b may be formed over the top surface of the interconnect component 104c. For example, the openings 120a and 120b may be formed in the top surface of the component 100f where two metal pillars are to be eventually formed. As illustrated, the openings 120a and 120b may expose the respective top surfaces of the interconnect components 104a and 104c. In some embodiments, the patterning of the photoresist layer 116 may be performed by an appropriate manner, e.g., by selective lithography exposure of the photoresist layer 116 (e.g., using an appropriate mask).

Figure 1G:
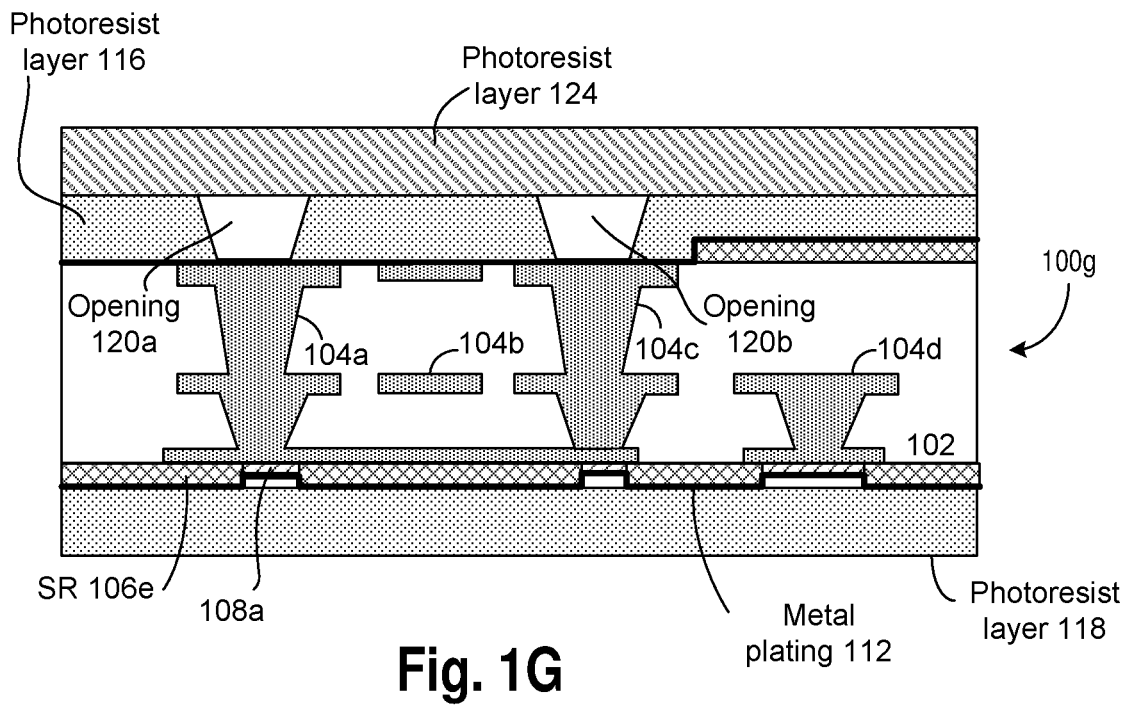

In FIG. 1G, another photoresist layer 124 may be deposited on the photoresist layer 116, thereby forming a component 100g. In an example, the photoresist layer 124 may be laminated on the photoresist layer 116. The photoresist layer 124 may be of any appropriate type and thickness. In an example, the photoresist layer 124 may comprise DFR material. In some embodiments, the photoresist layers 116 and 124 may be of the same type, although these layers may be of different types in some other embodiments. In some embodiments, if the metal pillars to be eventually formed on the substrate 102 have the height of about h, then a thickness of the photoresist layer 124 may be about h/2.

Figure 1H:
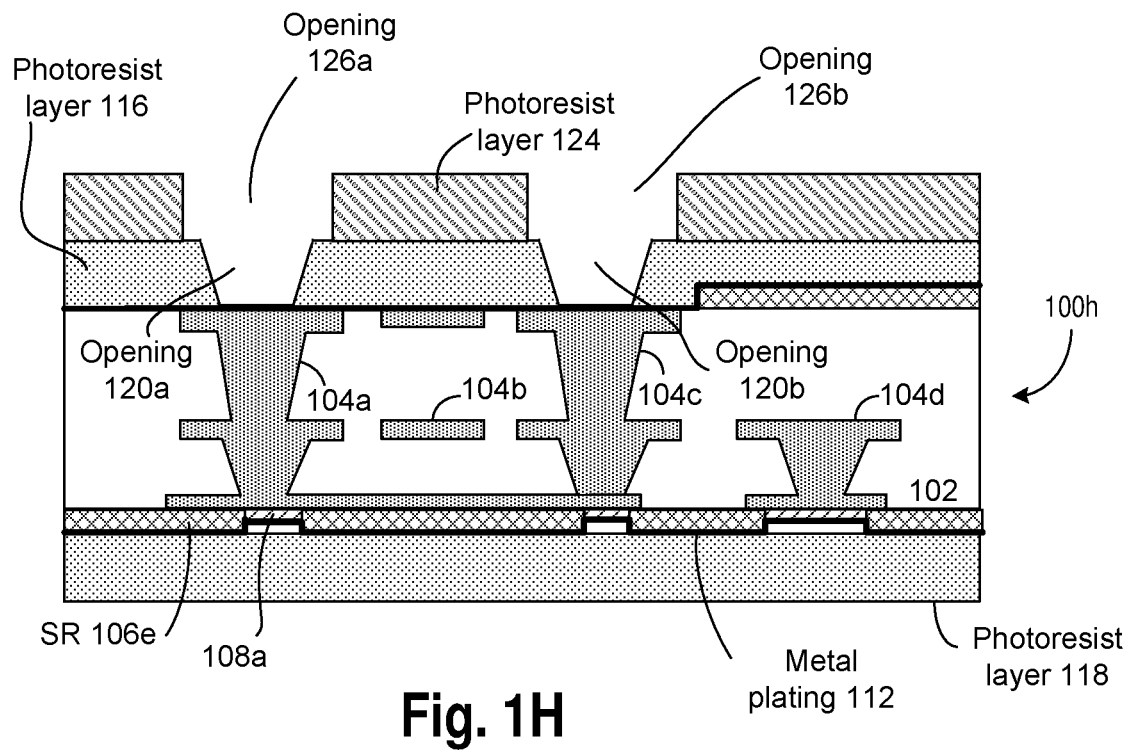

In FIG. 1H, the photoresist layer 124 may be patterned to form openings 126a and 126b, thereby forming a component 100h. In some embodiments, the opening 126a may be aligned on top of the opening 120a, and the opening 126b may be aligned on top of the opening 120b. For example, the openings 120a and 126a may expose at least a part of the top surface of the interconnect component 104a (e.g., where a metal pillar is to be eventually formed); and the openings 120b and 126b may expose at least a part of the top surface of the interconnect component 104c (e.g., where another metal pillar is to be eventually formed). In some embodiments, the patterning of the photoresist layer 124 to form the openings 126a and 126b may be performed by any appropriate manner, e.g., by selective lithography exposure of the photoresist layer 124 (e.g., using an appropriate mask), or the like.

Figure 1I:
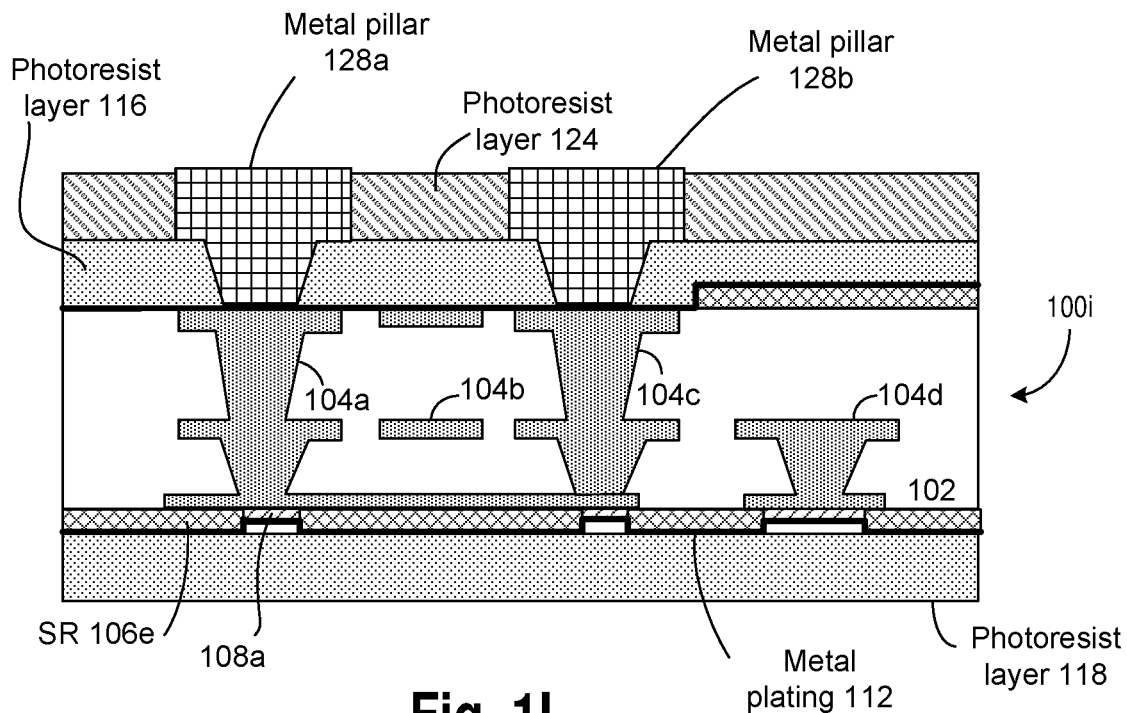

In FIG. 1I, the openings 120a and 126a may be filed or plated with metal (e.g., copper) to form a metal pillar 128a of a component 100i. Similarly, the openings 120b and 126b may be filed or plated with metal (e.g., copper) to form another metal pillar 128b.

Figure 1J:
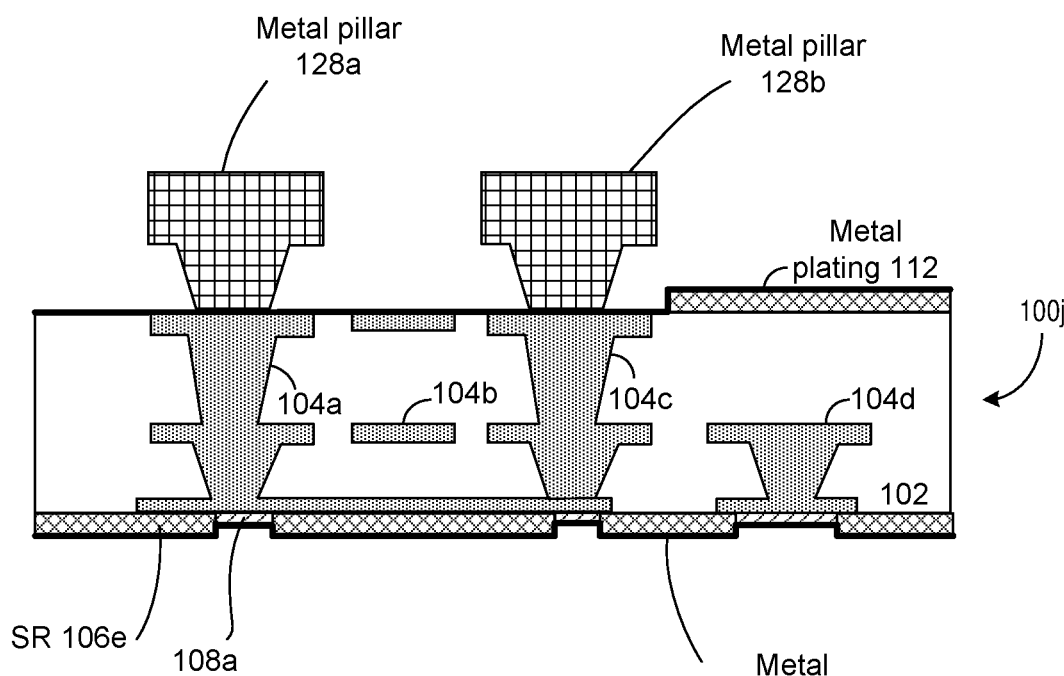

In FIG. 1J, the photoresist layers 116, 118, and 124 may be removed to form a component 100j. The photoresist layers 116, 118, and 124 may be removed by any appropriate technique, e.g., by peeling these layers, by treating these layers with appropriate chemicals and/or heat, by etching these layers, by exposing these layers to laser, by lithographic exposure, a combination of two or more of these techniques, and/or the like.

Figure 1K:
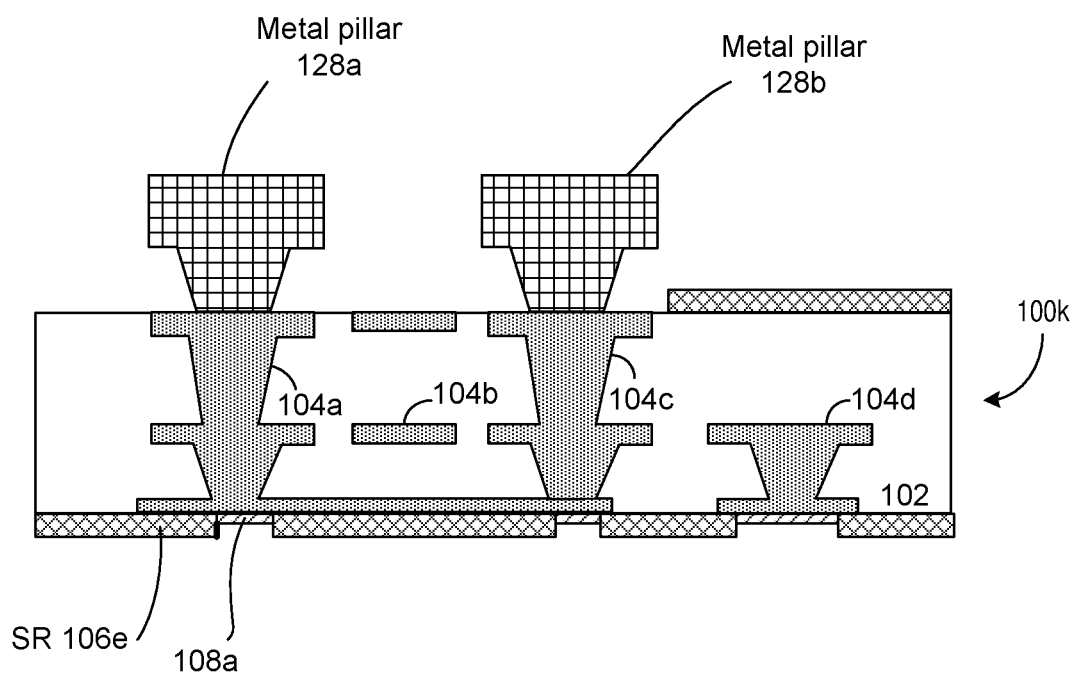

In FIG. 1K, the metal plating 112 from the top and bottom surfaces of the component 100j may be removed to form a component 100k. The metal plating 112 may be removed, for example, through an appropriate etching process.

As illustrated in FIGS. 1A-1K, in some embodiments, the metal pillar 128a may be formed using two photoresist layers 116 and 124, e.g., by depositing metal in the openings 120a and 126a of the two respective photoresist layers 116 and 124. Thus, for example, the metal pillar 128a may have two sections—a first section that may be formed by depositing metal in the opening 120a of the photoresist layer 116, and a second section that may be formed by depositing metal in the opening 126a of the photoresist layer 124. In an example, if the metal pillar 128a has a height of about h, then a thickness of each of the photoresist layers 116 and 124 may be about h/2.

In some embodiments, edges of the above discussed two sections of a metal pillar may be misaligned. For example, the metal pillar 128a may have two sections—the first section that may be formed by depositing metal in the opening 120a of the photoresist layer 116, and the second section that may be formed by depositing metal in the opening 126a of the photoresist layer 124. The first section of the metal pillar 128a may have a first edge at a segment of the metal pillar 128a where the first section and the second section of the metal pillar are attached, and the second section of the metal pillar 128a may have a second edge at the segment of the metal pillar 128a where the first section and the second section of the metal pillar are attached. In some embodiments and as illustrated in FIG. 1K, the first edge may be misaligned with respect to the second edge. For example, because the two sections are formed using two different openings in two different photoresist layer, the edges of the two sections (e.g., where the two sections meet) may not be aligned.

There are many advantages of forming a metal pillar using two photoresist layers. For example, assume that the metal pillars 128a and 128b are relatively tall (e.g., has a relatively large height). A conventional system may be a single photoresist layer to form a metal pillar. However, for a relatively tall metal pillar, the single photoresist layer may have to be relatively thicker. But to create an opening in the relatively thicker photoresist layer, the diameter of the opening may get relatively large. Accordingly, it may not be possible to form tall metal pillars having relatively smaller diameter using a single photoresist layer. In contrast, in the embodiments discussed herein, even if the metal pillars 128a and 128b are relatively tall (e.g., having a height of h), individual photoresist layers 116 and 124 may have a thickness that is about half the height h of the metal pillars 128a and 128b. Accordingly, the diameters of the openings 120a and 124a (and also openings 120b and 124b) can be made relatively small, thereby resulting in relatively smaller diameter of the metal pillars 128a and 128b. Such a lower diameter of the metal pillars 128a and 128 may not be achievable using a single photoresist layer (e.g., instead of the two photoresist layers 116 and 124). Also, reducing the diameter of the metal pillars 128a and 128b may result in a relatively smaller pitch for the metal pillars, and thus, smaller pitch for the interconnect structures of a POP component, thereby reducing a x-y dimension of the POP component.

Although FIGS. 1A-1K illustrate formation of only two metal pillars on the substrate 102, any other appropriate number of such metal pillars may be formed on the substrate 102, as would be readily understood by those skilled in the art based on the teachings of this disclosure.

Figure 2A:
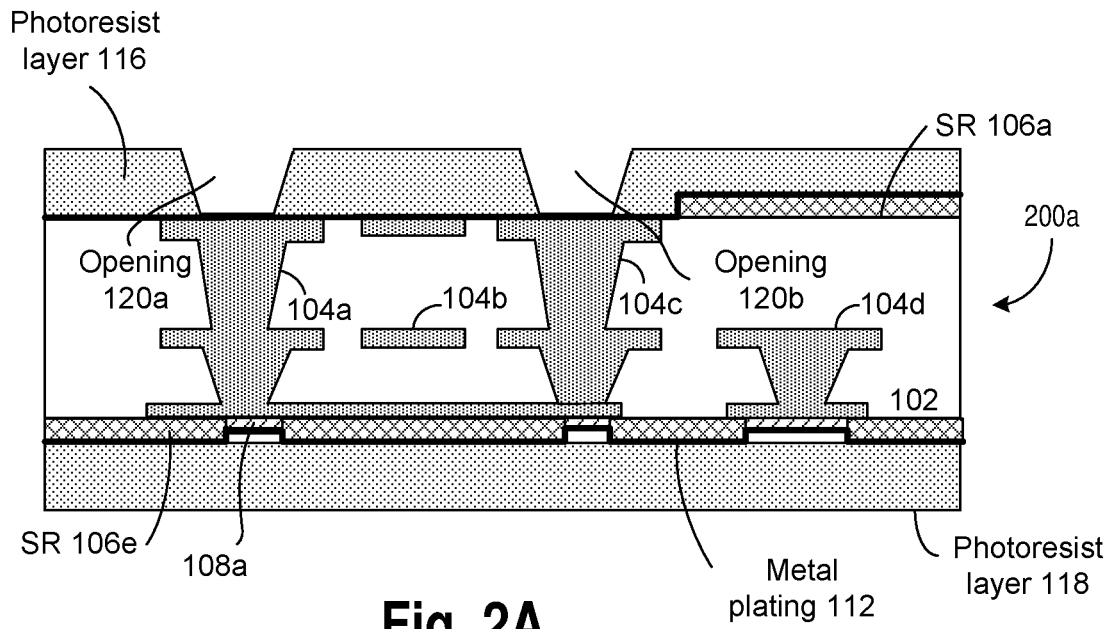
FIGS. 2A-2G schematically illustrate various operations associated with formation of a plurality of metal pillars on a substrate, where metal is deposited in two different operations to form each metal pillar, according to some embodiments.

In FIGS. 1A-1K, the openings 120a and 124a are filed or plated at the same time with metal. However, in some other embodiments, these openings can be filed at different times, e.g., as discussed with respect to FIGS. 2A-2G. FIGS. 2A-2G schematically illustrate various operations associated with formation of a plurality of metal pillars (also referred to herein as metal posts) on a substrate, where metal is deposited in two different operations to form each metal pillar, according to some embodiments. FIG. 2A illustrates a component 200a that is similar to the component 100f of FIG. 1F (e.g., has openings 120a and 120b formed on the photoresist layer 116), and hence, formation the component 200a of FIG. 2A is not discussed in further detail.

Figure 2B:
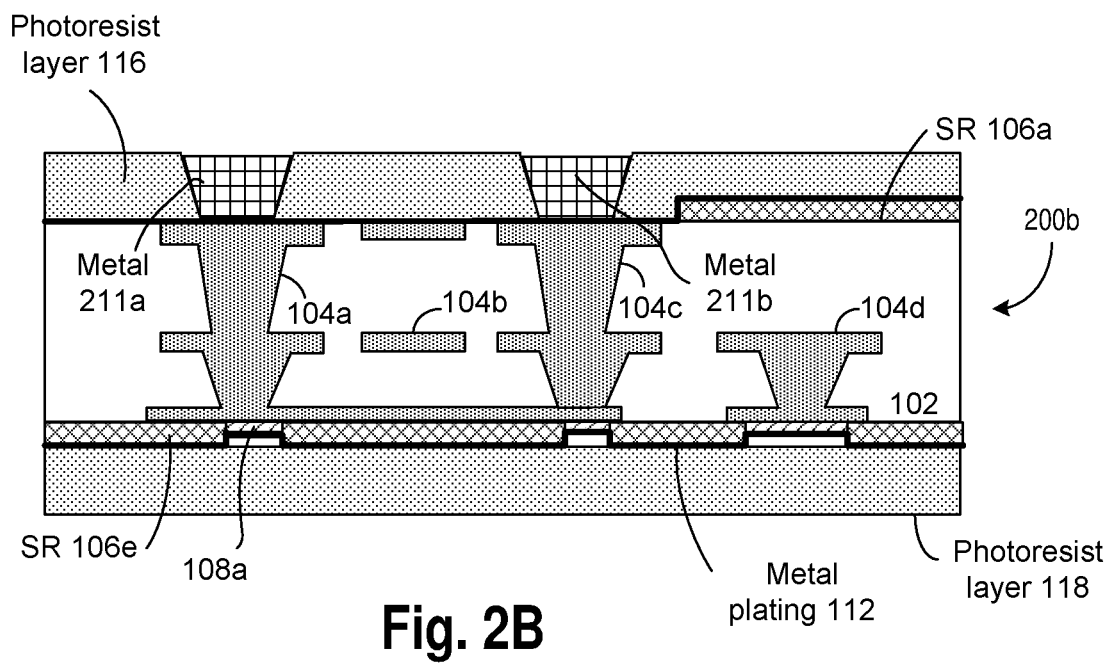

In FIG. 2B, the openings 120a and 120b are respectively filed or plated with metal 211a and 211b, thereby forming component 200b. Any appropriate type of metal (e.g., copper) may be used to fill the openings 120a and 120b. In some embodiments, the openings 120a and 120b may be slightly under-filled with metal 211a and 211b, respectively, although in some other embodiments, the metal 211a and 211b may be flush with the top surface of the photoresist layer 116 (or the openings 120a and 120b may be over-filled with metal 211a and 211b, respectively, e.g., such that the metal 211a and 211b overflows the respective openings).

Figure 2C:
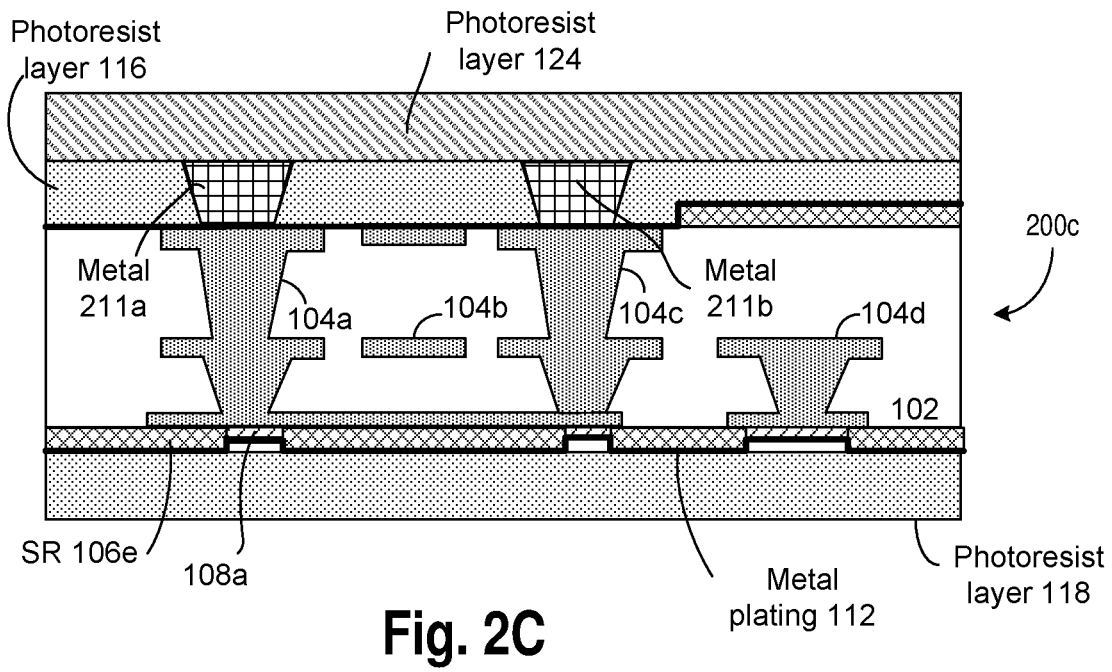

In FIG. 2C, the photoresist layer 124 may be deposited on the photoresist layer 116 of the component 200b (e.g., similar to FIG. 1G), thereby forming the component 200c. In an example, the photoresist layer 124 may be laminated on the photoresist layer 116.

Figure 2D:
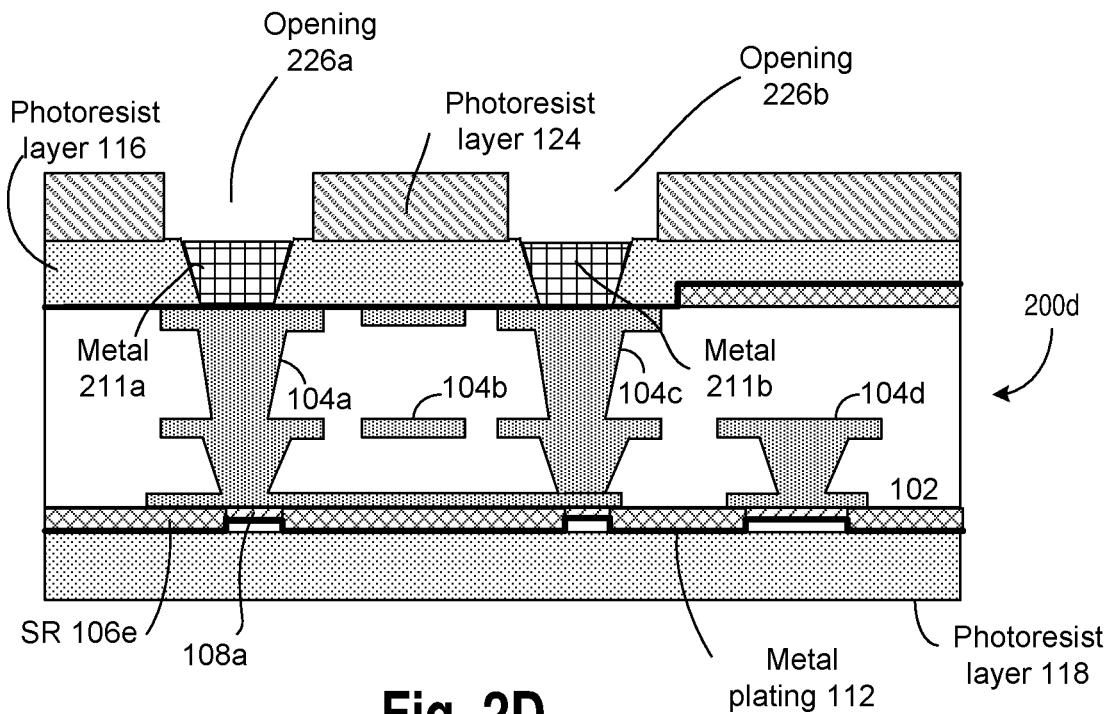

In FIG. 2D, the photoresist layer 124 may be patterned to form openings 226a and 226b, thereby forming a component 200d. In some embodiments, the opening 226a may be aligned on top of the metal 211a, and the opening 226b may be aligned on top of the metal 211b. For example, the openings 226a and 226b may expose at least a part of the metals 211a and 211b, respectively. In some embodiments, the patterning of the photoresist layer 124 to form the openings 226a and 226b may be performed by any appropriate manner, e.g., by selective lithography exposure of the photoresist layer 124 (e.g., using an appropriate mask), or the like.

Figure 2E:
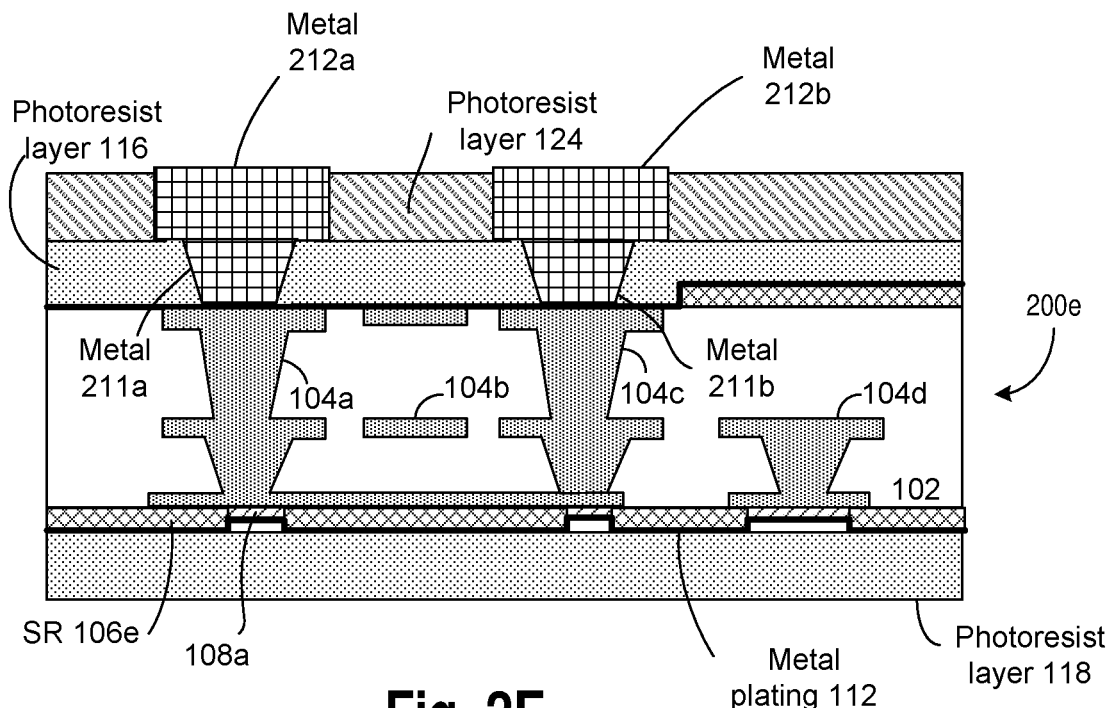

In FIG. 2E, the openings 226a and 226b may be filed with metal 212a and 212b, respectively, thereby forming a component 200e. Any appropriate type of metal (e.g., copper) may be used to fill the openings 226a and 226b. In some embodiments, the metal 211a, 212a, 211b, and 212b may comprise similar type of metal, e.g., copper (although in other embodiments, different types of metal may also be used).

Figure 2F:
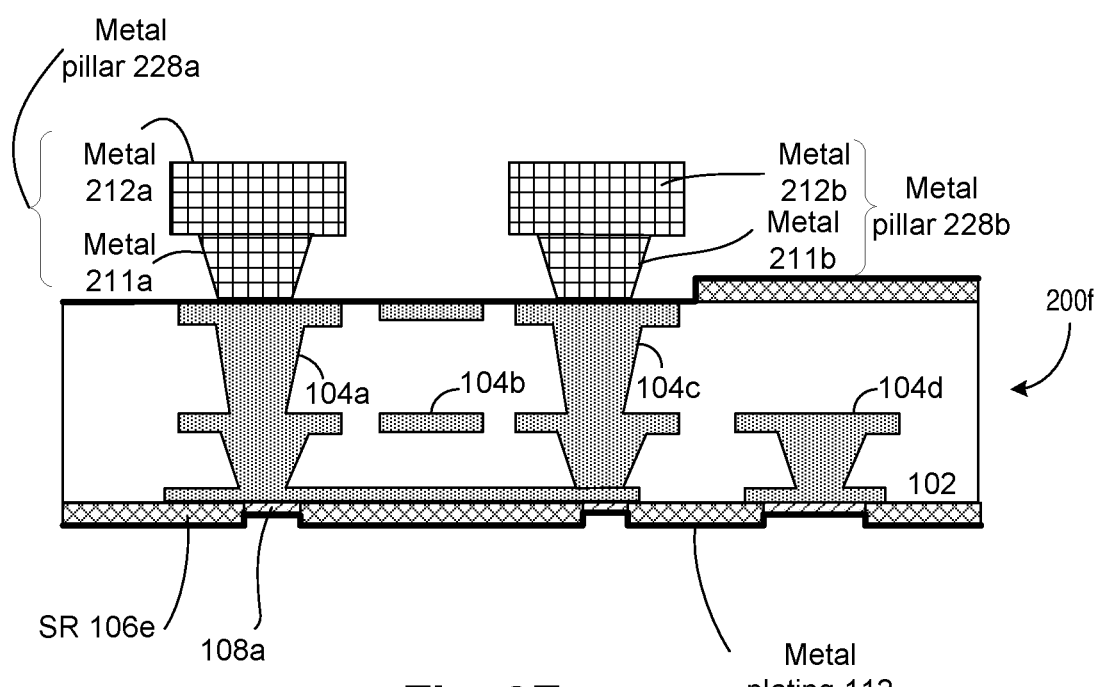

In FIG. 2F, the photoresist layers 116, 118, and 124 may be removed to form a component 200f. The photoresist layers 116, 118, and 124 may be removed by any appropriate technique, e.g., by peeling these layers, by treating these layers with appropriate chemicals and/or heat, by etching these layers, by exposing these layers to laser, by lithographic exposure, a combination of two or more of these techniques, and/or the like. In some embodiments, as illustrated in FIG. 2F, the metal 211a and 212a, in combination, form a metal pillar 228a; and the metal 211b and 212b, in combination, form a metal pillar 228b.

Figure 2G:
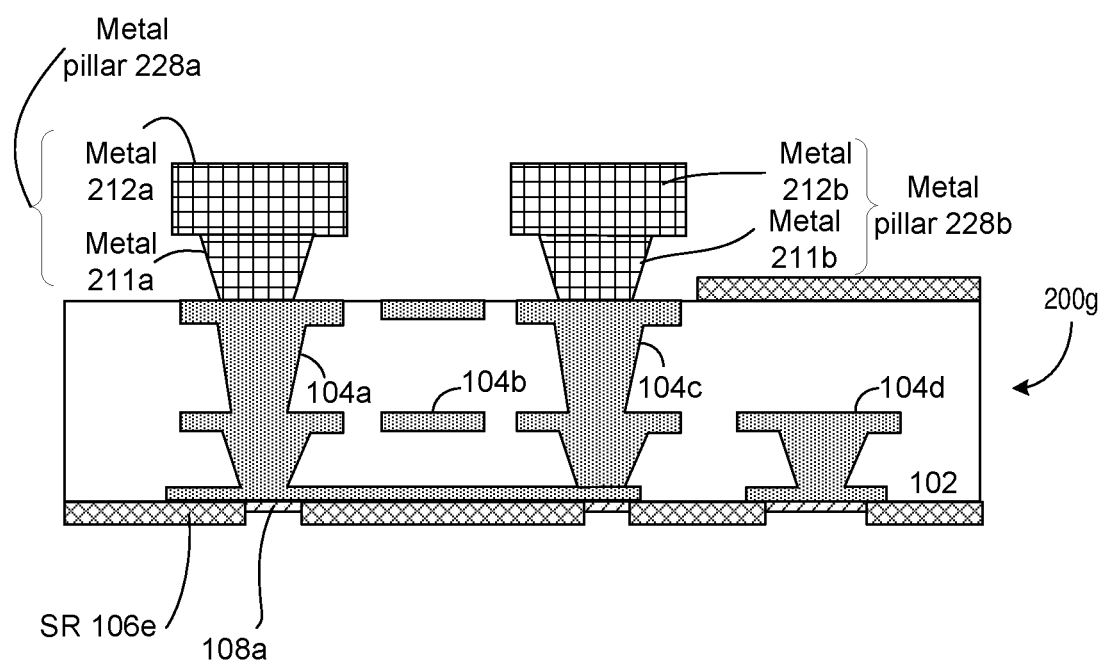

In FIG. 2G, the metal plating 112 from the top and bottom surfaces of the component 200f may be removed to form a component 200g. The metal plating 112 may be removed, for example, through an appropriate etching process.

As illustrated in FIGS. 2A-2G, in some embodiments, the metal pillar 228a is formed by depositing metal 211a in the opening 120a, and depositing metal 212a in the opening 226a. Thus, for example, the metal pillar 228a may have two sections—a first section that may be formed by depositing the metal 211a in the opening 120a of the photoresist layer 116, and a second section that may be formed by depositing the metal 212a in the opening 226a of the photoresist layer 124. The component 100k of FIG. 1K and the component 200g of FIG. 2G have substantially similar structure, although the metal pillars 128a and 128b of FIG. 1K may be formed by a single deposition of metal in the respective openings, while the metal pillars 228a and 228b may be formed by depositing metal in two stages.

In the embodiments discussed with respect to FIGS. 1A-1K, metal is deposited or plated once (e.g., as discussed with respect to FIG. 1I) to form a metal pillar, while photoresist layers (e.g., photoresist layers 116 and 124, which may be DFR) are deposited twice. Accordingly, the operations depicted in FIGS. 1A-1K for forming metal pillars may also be termed as a double DFR lamination and single plate process. In FIGS. 1A-1K, while forming, for example, the metal pillar 128a, the metal may be deposited in the openings 120a and 126a in a single, continuous operation, e.g., as discussed with respect to FIG. 1I.

In the embodiments discussed with respect to FIGS. 2A-2G, metal is deposited or plated twice (e.g., as discussed with respect to FIGS. 2B and 2D) to form a metal pillar, and photoresist layers (e.g., photoresist layers 116 and 124, which may be DFR) are deposited twice. Accordingly, the operations depicted in FIGS. 2A-2G for forming metal pillars may also be termed as a double DFR lamination and double plate process. In FIGS. 2A-2G, while forming, for example, the metal pillar 228a, the metal may be deposited in the openings 120a and 226a in two different and discontinuous operations, e.g., as discussed with respect to FIGS. 2B and 2E.

FIGS. 1A-1K and 2A-2G discusses formation of metal pillars by forming openings in photoresist layers, for example, by selective lithography exposure of the photoresist layer. However, the principles of this disclosure are not limited to forming openings in the photoresist layers using selective lithography exposure. For example, instead of (or in addition to) using photoresist layers in these figures, any other appropriate layers may be used, and/or mechanical or laser drilling can be used to form openings in these layers, which may then be used to form the metal pillars. For example, the principles of this disclosure may be used to form a metal pillar by forming a first opening in a first layer and forming a second opening in a second layer (e.g., such that the two openings are aligned)—metal may be deposited in the first and second openings to form the metal pillar. Although FIGS. 1A-2G discuss forming the first and second openings using specifically photoresist layers and lithography exposure, in some other embodiments, any appropriate layer may be used and any appropriate mechanism (e.g., laser drilling, mechanical drilling, selective etching, etc.) may be used to form the openings in such layers to form the metal pillars.

Although FIGS. 1A-2G illustrate using two photoresist layers to form metal pillars, in some embodiments, more than two such photoresist layers may also be used to form metal pillars. For example, for a relatively tall metal pillar having a height of H, three photoresist layers (e.g., each having a height of about H/3) may be used to form the metal pillars, as would be readily understood by those skilled in the art based on the teachings of this disclosure.

Figure 3A:
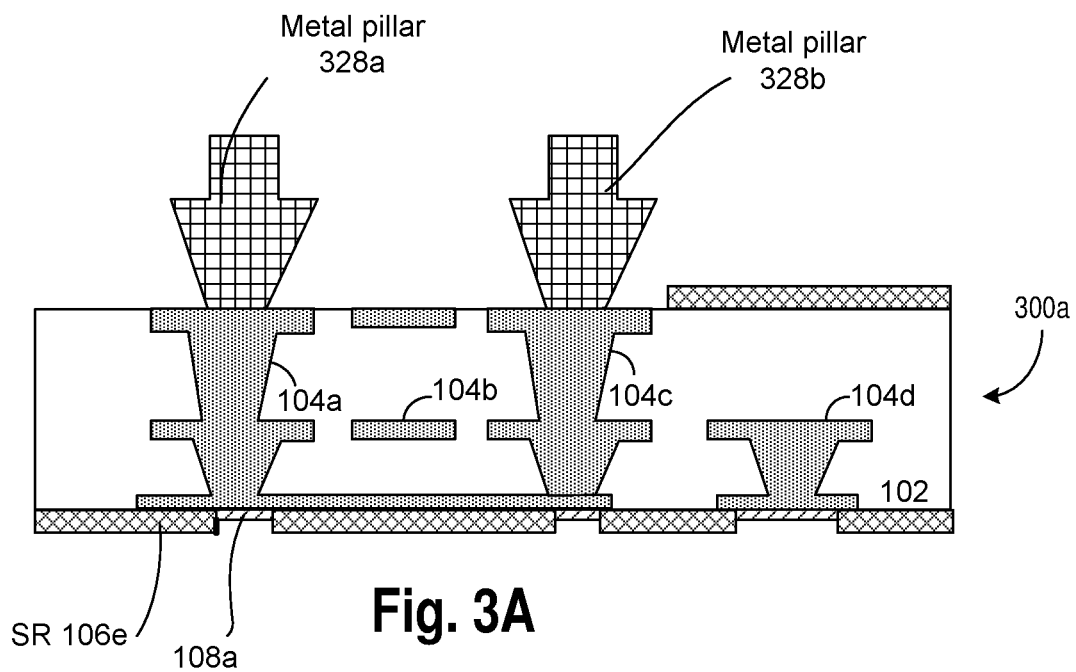
FIGS. 3A-3D illustrate examples of various example profiles of metal pillars, according to some embodiments.
Figure 3B:
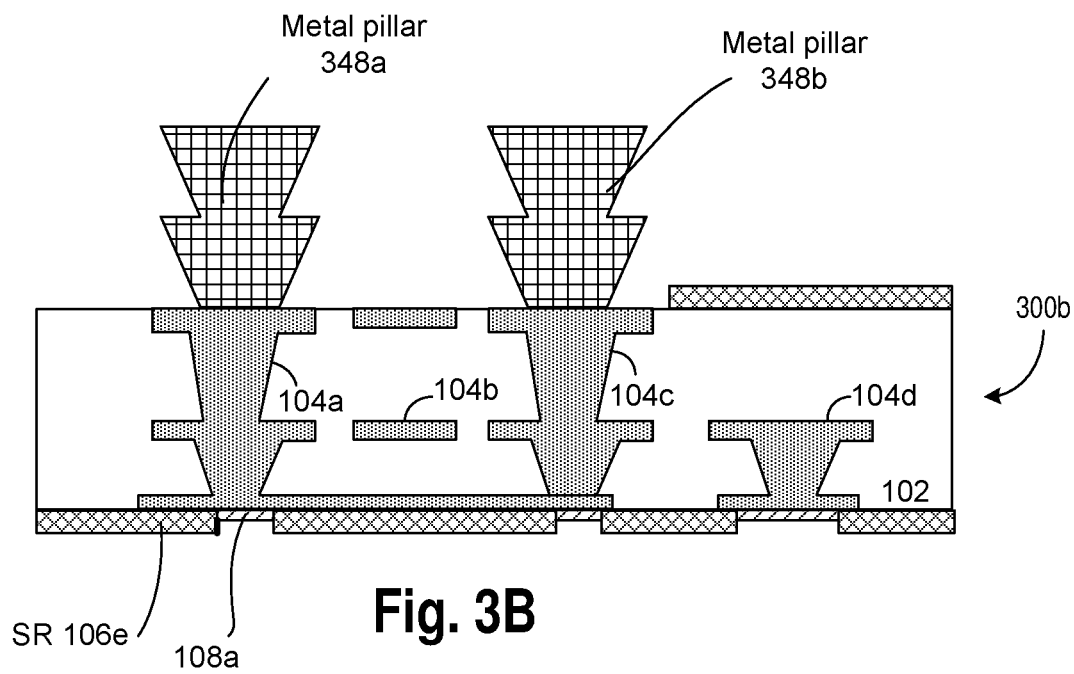
Figure 3C:
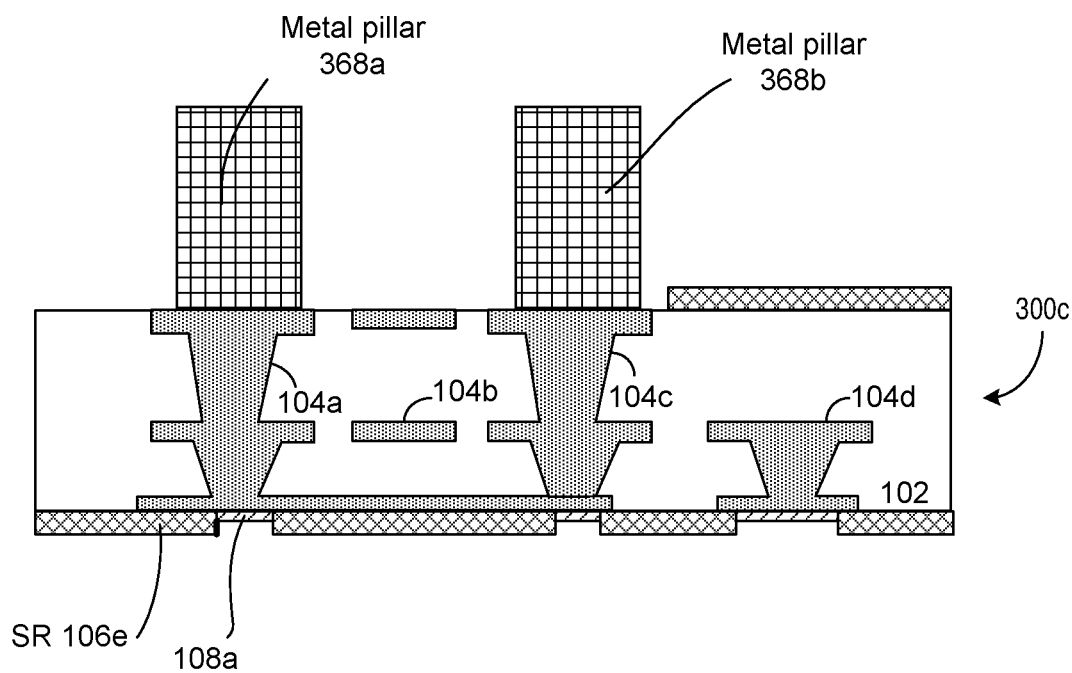
Figure 3D:
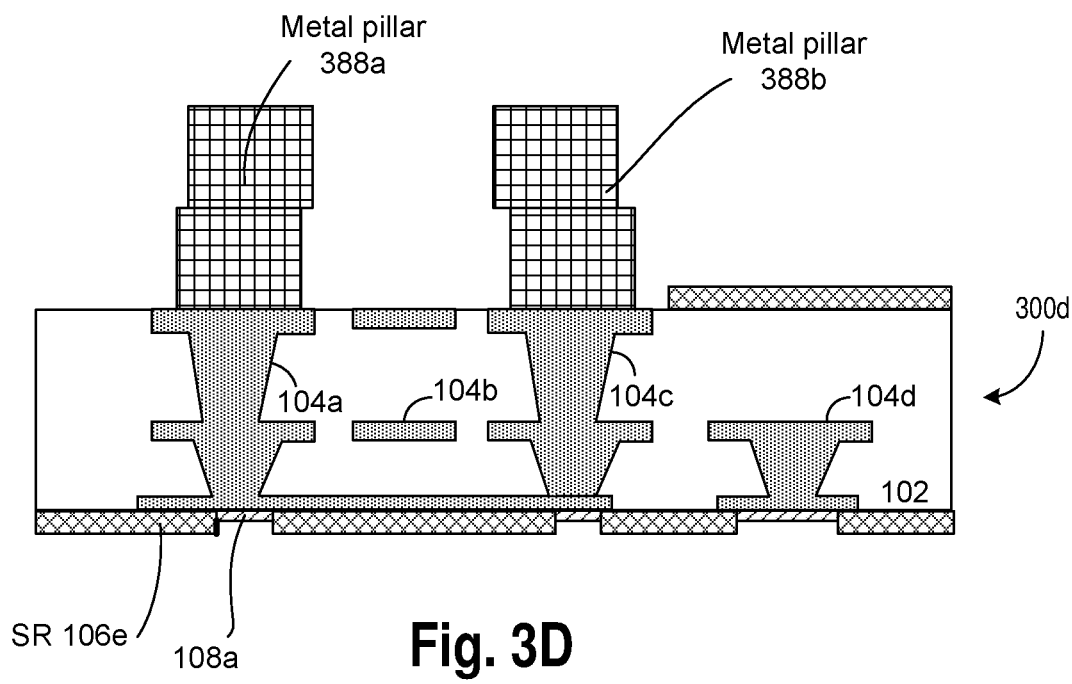

Although FIGS. 1K and 2G illustrate specific profiles of various metal pillars, in some embodiments, any different profile (e.g., shapes, sizes, numbers, etc.) of metal pillars may also be achieved using the principles of this disclosure. For example, FIGS. 3A-3D illustrate examples of various profiles of metal pillars, according to some embodiments. For example, FIG. 3A illustrates a component 300a comprising metal pillars 328a and 328b, FIG. 3B illustrates a component 300b comprising metal pillars 348a and 348b, FIG. 3C illustrates a component 300c comprising metal pillars 368a and 368b, and FIG. 3D illustrates a component 300d comprising metal pillars 388a and 388b. In FIG. 3C, the two patterns to form the pillars 368a and 368b are assumed to be substantially aligned, thereby resulting in about the rectangular shape of the pillars 368a and 368b. However, the two patterns to form the pillars may not be substantially aligned. FIG. 3D, for example, illustrates a scenario where the two patterns are not aligned, resulting in misalignment and non-rectangular shapes of the pillars 388a and 388b.

Each of the components 300a, 300b, and 300c are at least in part similar to the component 100k and 200g of FIGS. 1K and 2G. However, the profiles of the metal pillars in the components 300a, 300b, and 300c may be different from those in the component 100k and 200g of FIGS. 1K and 2G.

The metal pillars in the components 300a, 300b, and 300c may be formed by operations that are at least in part similar to the operations discussed with respect to FIGS. 1A-1K, and/or FIGS. 2A-2G. Accordingly, the formation of the metal pillars in the components 300a, 300b, and 300c will not be discussed in further detail herein. Although FIGS. 3A-3D illustrate some example profiles of the metal pillars, any other appropriate profiles of the metal pillars may also be formed, as would be understood by those skilled in the art based on the teachings of this disclosure.

In some embodiments, in the metal pillars illustrated in FIGS. 3A-3D, individual metal pillar may have two corresponding sections—a first section that may be formed by depositing metal in a first opening of a first photoresist layer, and a second section that may be formed by depositing metal in a second opening of a second photoresist layer. The first section of the metal pillar may have a first edge at a segment of the metal pillar where the first section and the second section of the metal pillar are attached, and the second section of the metal pillar may have a second edge at the segment of the metal pillar where the first section and the second section of the metal pillar are attached. In some embodiments, the first edge may be misaligned with respect to the second edge. For example, because the two sections are formed using two different openings in two different photoresist layers, the edges of the two sections (e.g., where the two sections meet) may not be aligned. In some embodiments, even in the example of FIG. 3C, there may be slight misalignment between the two sections, e.g., because the two openings in the two photoresist layers may not have perfectly aligned edges (although, for example, in some other embodiments, the two sections of a metal pillar of FIG. 3C may be fully or substantially aligned). However, a conventional metal pillar formed using a single opening in a single photoresist layer may not have two such sections, and may not have any such misalignment.

Referring again to FIG. 1A, the top surface and the bottom surface of the substrate 102 are respectively labeled as S1 and S2. Various embodiments discussed herein refers to metal pillars formed on the top surface S1 of the substrate 102. However, in some other embodiments, metal pillars may also be formed on the bottom surface S2 of the substrate 102 as well using the teachings of this disclosure (e.g., instead of, or in addition to, forming metal pillars on the top surface S1), as would be readily appreciated by those skilled in the art based on the teachings of this disclosure.

Figure 4A:
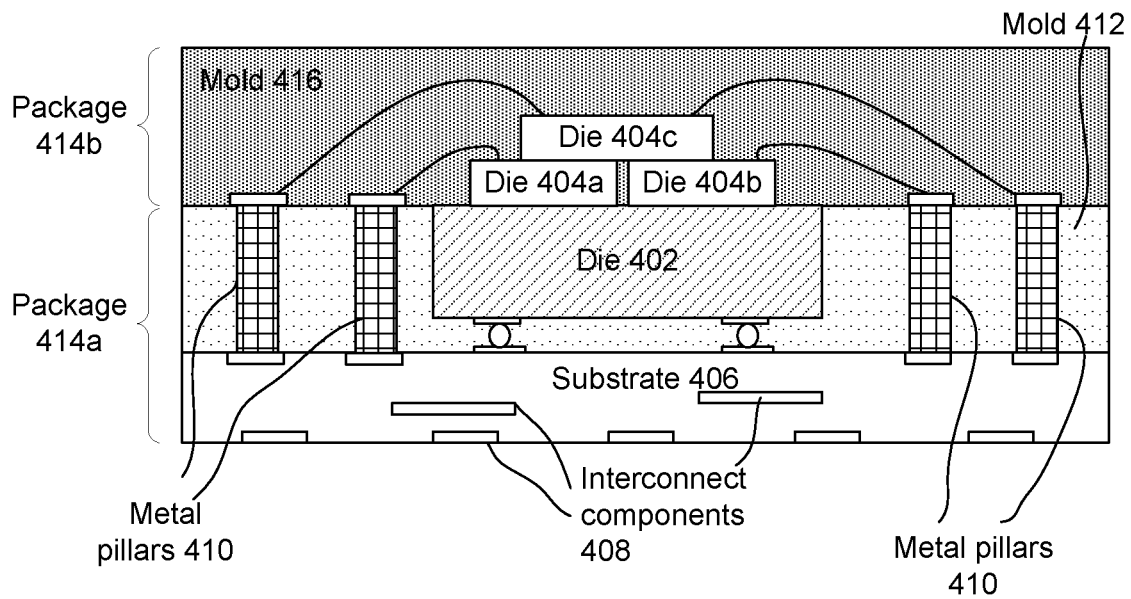
FIGS. 4A and 4B illustrate example semiconductor packages where metal pillars of some of FIGS. 1A-3D may be employed, according to some embodiments.
Figure 4B:
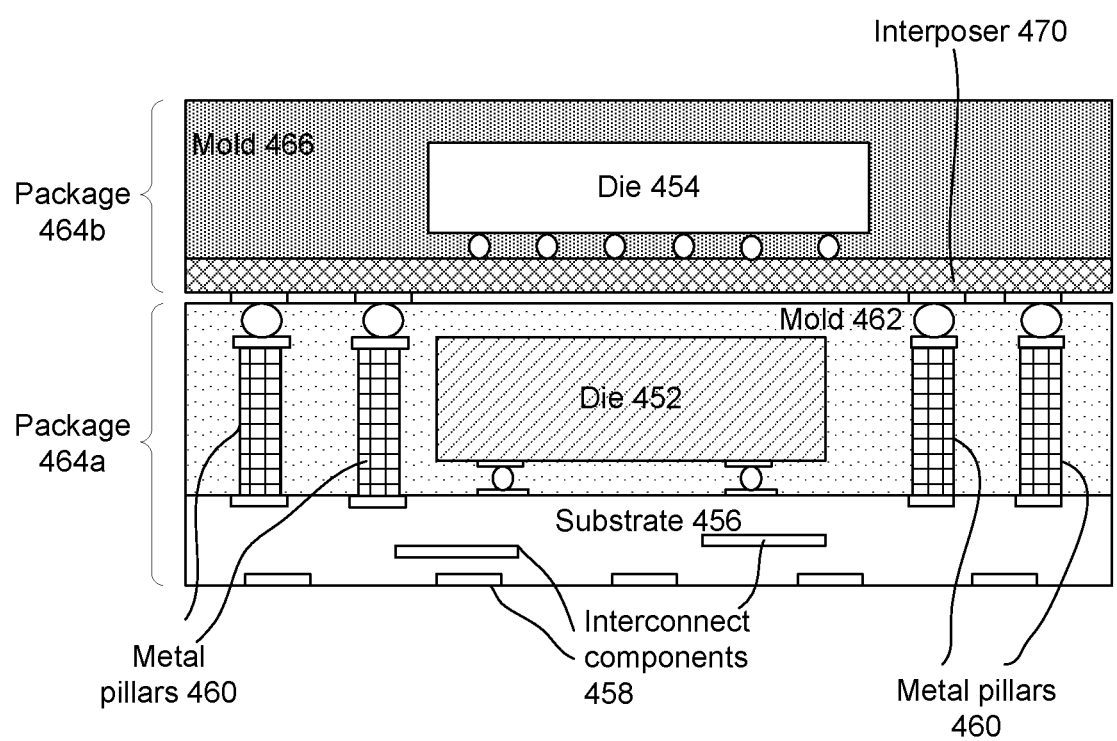

FIGS. 4A and 4B illustrate some example semiconductor packages where metal pillars of some of FIGS. 1A-3D may be employed, according to some embodiments. Referring to FIG. 4A, a cross-sectional view of at least a section of a substrate 406 is displayed. In some embodiments, the substrate 406 comprises interconnect components 408, only some of which are illustrated and/or labeled in FIG. 4A. A die 402 may be mounted on the substrate 406, for example, in a flip-chip configuration.

In some embodiments, metal pillars 410 may be formed on the substrate 406. In an example, the metal pillars 410 may be formed by one or more of the operations discussed herein (e.g., formed using the operations discussed with respect to FIGS. 1A-1K, and/or operations discussed with respect to FIGS. 2A-2G). In some embodiments, subsequent to forming the metal pillars 410, molding compound 412 may be deposited on the substrate 406, where the molding compound 412 may encapsulate at least sections of the metal pillars 410 and the die 402. In some embodiments, the die 402, the metal pillars 410, and the substrate 406 may be a part of a semiconductor package 414a.

In some embodiments, one or more dies, e.g., dies 404a, 404b, 404c, may be stacked on the die 402. In an example, the dies 404a, 404b, and 404c can be stacked in any appropriate configuration, e.g., in a side by side configuration, stacked on top of one another, or in the manner illustrated in FIG. 4A. In some embodiments, the dies 404a, 404b, and 404c may be wire-bonded to the metal pillars 410, e.g., as illustrated in FIG. 4A. In some embodiments, molding compound 416 may encapsulate the dies 404a, 404b, and 404c. In some embodiments, the dies 404a, 404b, and 404c and the molding compound 416 may be a part of a package 414b. Thus, for example, FIG. 4A may illustrate a package-on-package structure. In some embodiments, the die 402 may be a processor die or a logic die, and one or more of the dies 404a, 404b, and 404c may be memory dies.

Referring to FIG. 4B, a cross-sectional view of at least a section of a substrate 456 is displayed. In some embodiments, the substrate 456 comprises interconnect components 458, only some of which are illustrated and/or labeled in FIG. 4B. A die 452 may be mounted on the substrate 458, for example, in a flip-chip configuration.

In some embodiments, metal pillars 460 may be formed on the substrate 456. In an example, the metal pillars 460 may be formed by one or more of the operations discussed herein (e.g., formed using the operations discussed with respect to FIGS. 1A-1K, and/or operations discussed with respect to FIGS. 2A-2G). In some embodiments, subsequent to forming the metal pillars 460, molding compound 462 may be deposited on the substrate 456, where the molding compound 462 may encapsulate at least sections of the metal pillars 460 and the die 452. In some embodiments, the die 452, the metal pillars 460, and the substrate 456 may be a part of a semiconductor package 464a.

In some embodiments, one or more dies, e.g., a die 454 may be stacked on an interposer layer 470, e.g., in a flip-chip configuration. In some embodiments, the interposer layer 470 may be attached to the package 464a such that, for example, the interposer layer 470 is electrically connected to the metal pillars 460 (e.g., via corresponding solder balls or other interconnect components, not labeled in FIG. 4B). The interposer layer 470, for example, may comprise one or more traces, re-distribution layers, power planed, ground planes, or other appropriate routing structures. In some embodiments, molding compound 466 may encapsulate the die 454. In some embodiments, the die 454, the molding compound 466, and the interposer layer 470 may be a part of a package 464b. Thus, for example, FIG. 4B may illustrate a package-on-package structure. In some embodiments, the die 452 may be a processor die or a logic die, and the die 454 may be a memory die.

FIG. 5 illustrates a flowchart depicting a method 500 for forming a metal pillar (e.g., one of the metal pillars illustrated in any of FIGS. 1A-3D), according to some embodiments. At 504, a first layer (e.g., one of the photoresist layer 116 of one of FIGS. 1A-2G) may be formed on a substrate (e.g., the substrate 102). In some embodiments, the first layer may be a DFR layer, although in some other embodiments, the first layer can be of any appropriate type.

At 508, the first layer may be patterned to form a first opening (e.g., opening 120a) in the first layer. In some embodiments, the first opening may be formed by lithographic exposure on the first layer, although in some other embodiments, the first opening can be formed by another appropriate manner (e.g., laser drilling, mechanical drilling, etching, and/or the like).

At 512, a second layer (e.g., photoresist layer 124) may be formed on the first layer. In some embodiments, the second layer may be a DFR layer, although in some other embodiments, the second layer can be of any appropriate type.

At 516, the second layer may be patterned to form a second opening in the second layer. In some embodiments, the second opening may be formed by lithographic exposure on the second layer, although in some other embodiments, the second opening can be formed by another appropriate manner (e.g., laser drilling, mechanical drilling, etching, and/or the like).

At 520, metal may be deposited in the first opening and the second opening to form a metal pillar. As discussed with respect to FIGS. 1A-1K, in some embodiments, the metal may be deposited in the first opening and the second opening in a single and continuous operation. As discussed with respect to FIGS. 2A-2G, in some other embodiments, the metal may be deposited in the first opening and the second opening in two different and discontinuous operations.

Although the blocks in the flowchart with reference to FIG. 5 are shown in a particular order, the order of the actions can be modified. Thus, the illustrated embodiments can be performed in a different order, and some actions/blocks may be performed in parallel. For example, in some embodiments, deposition of metal in the first opening (e.g., as discussed with respect to block 520) may be performed prior to forming the second layer (e.g., as discussed with respect to block 512). Some of the blocks and/or operations listed in FIG. 5 may be optional in accordance with certain embodiments. The numbering of the blocks presented is for the sake of clarity and is not intended to prescribe an order of operations in which the various blocks must occur.

Figure 6:
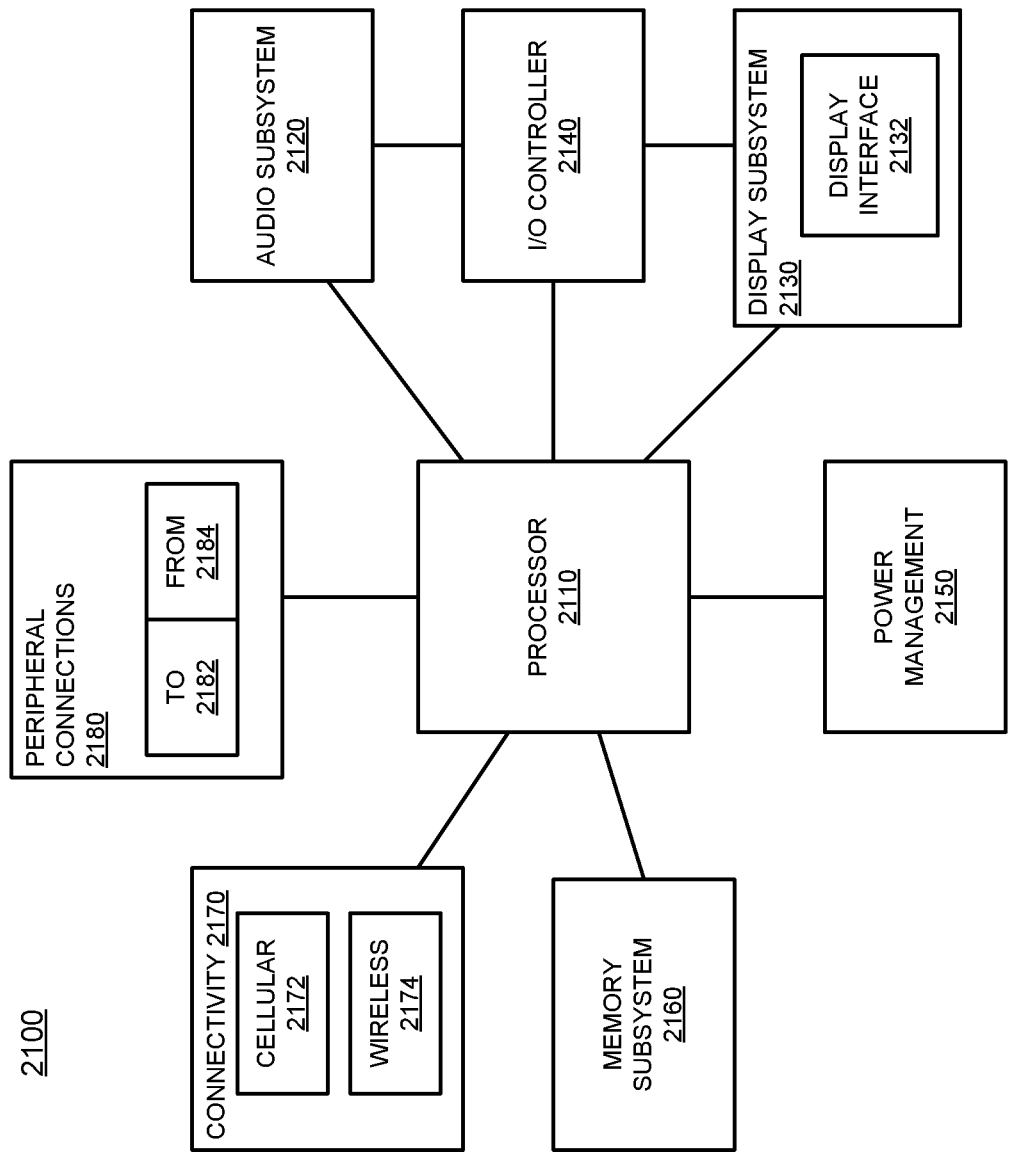
FIG. 6 illustrates a computer system or a SoC (System-on-Chip), where metal pillars of some of FIGS. 1A-3D may be employed, according to some embodiments.

FIG. 6 illustrates a computer system or a SoC (System-on-Chip) 2100, where metal pillars of some of FIGS. 1A-3D may be employed, according to some embodiments. It is pointed out that those elements of FIG. 5 having the same reference numbers (or names) as the elements of any other figure can operate or function in any manner similar to that described, but are not limited to such. One or more components of the SOC 2100 may be included in the packages illustrated in FIGS. 4A-4B.

In some embodiments, computing device 2100 represents an appropriate computing device, such as a computing tablet, a mobile phone or smart-phone, a laptop, a desktop, an IOT device, a server, a set-top box, a wireless-enabled e-reader, or the like. It will be understood that certain components are shown generally, and not all components of such a device are shown in computing device 2100.

In some embodiments, computing device 2100 includes a first processor 2110. The various embodiments of the present disclosure may also comprise a network interface within 2170 such as a wireless interface so that a system embodiment may be incorporated into a wireless device, for example, cell phone or personal digital assistant.

In one embodiment, processor 2110 can include one or more physical devices, such as microprocessors, application processors, microcontrollers, programmable logic devices, or other processing means. The processing operations performed by processor 2110 include the execution of an operating platform or operating system on which applications and/or device functions are executed. The processing operations include operations related to I/O (input/output) with a human user or with other devices, operations related to power management, and/or operations related to connecting the computing device 2100 to another device. The processing operations may also include operations related to audio I/O and/or display I/O.

In one embodiment, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110.

Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user.

I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In one embodiment, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In one embodiment, computing device 2100 includes power management 2150 that manages battery power usage, charging of the battery, and features related to power saving operation. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100. In one embodiment, computing device 2100 includes a clock generation subsystem 2152 to generate a clock signal.

Elements of embodiments are also provided as a machine-readable medium (e.g., memory 2160) for storing the computer-executable instructions (e.g., instructions to implement any other processes discussed herein). The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 2180 include hardware interfaces and connectors, as well as software components (e.g., drivers, protocol stacks) to make peripheral connections. It will be understood that the computing device 2100 could both be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems.

In addition to a proprietary docking connector or other proprietary connection hardware, the computing device 2100 can make peripheral connections 2180 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, the processor 2110 (or another component of the computing device 2100) may be implemented as one of the dies 402 or 452 of FIGS. 4A-4B. In some embodiments, one or more memory dies of the memory subsystem 2160 (or another component of the computing device 2100) may be implemented as one of the dies 404 or 454 of FIGS. 4A-4B. In such embodiments, the metal pillars illustrated in FIGS. 4A-4B may be formed using some of the operations discussed with respect to FIGS. 1A-2G.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following example clauses pertain to further embodiments. Specifics in the example clauses may be used anywhere in one or more embodiments. All optional features of the apparatus described herein may also be implemented with respect to a method or process.

Clause 1. An apparatus comprising: a substrate; and a metal pillar formed on the substrate, the metal pillar comprising a first section and a second section, wherein the first section of the metal pillar has a first edge at a segment of the metal pillar where the first section and the second section of the metal pillar are attached, wherein the second section of the metal pillar has a second edge at the segment of the metal pillar where the first section and the second section of the metal pillar are attached, and wherein the first edge is misaligned with respect to the second edge.

Clause 2. The apparatus of clause 1, wherein: the first section of the metal pillar is formed by depositing metal in a first opening of a first photoresist layer; and the second section of the metal pillar is formed by depositing metal in a second opening of a second photoresist layer.

Clause 3. The apparatus of clause 2, wherein: metal is deposited in the first opening of the first photoresist layer in a first operation; and metal is deposited in the second opening of the second photoresist layer in a second operation that is discontinuous with respect to the first operation.

Clause 4. The apparatus of clause 2, wherein: metal is deposited in the first opening of the first photoresist layer and in the second opening of the second photoresist layer in a continuous operation.

Clause 5. The apparatus of any of clauses 1-4, wherein: the metal pillar comprises a copper pillar or a copper post.

Clause 6. A method comprising: forming a first layer on a substrate; patterning the first layer to form a first opening in the first layer; forming a second layer on the first layer; patterning the second layer to form a second opening in the second layer; and depositing metal in the first opening and the second opening to form a metal pillar.

Clause 7. The method of clause 6, further comprising: removing the first layer and the second layer subsequent to forming the metal pillar.

Clause 8. The method of any one of clauses 6-7, wherein depositing the metal comprises: depositing the metal in the first opening and the second opening subsequent to forming the second opening.

Clause 9. The method of clause 8, wherein depositing the metal further comprises: depositing the metal in the first opening and the second opening in a single continuous operation.

Clause 10. The method of any one of clauses 6-7, wherein depositing the metal comprises: depositing first metal in the first opening prior to forming the second layer on the first layer.

Clause 11. The method of clause 10, wherein depositing the metal further comprises: depositing the first metal in the first opening in a first operation; and depositing the second metal in the second opening in a second operation that is discontinuous with respect to the first operation.

Clause 12. The method of any one of clauses 6-7, wherein: the metal pillar has a first height; and the first layer has a height that is about half the height of the metal pillar.

Clause 13. The method of clause 12, wherein: the second layer has a height that is about half the height of the metal pillar.

Clause 14. The method of any one of clauses 6-7, wherein: the metal comprises copper.

Clause 15. The method of any one of clauses 6-7, wherein: the first opening is substantially aligned on top of the second opening.

Clause 16. The method of any one of clauses 6-7, wherein: the first layer is a first photoresist layer; and the second layer is a second photoresist layer.

Clause 17. The method of any one of clauses 6-7, wherein: the first layer is a first dry film resist (DFR) layer; and the second layer is a second DFR layer.

Clause 18. The method of any one of clauses 6-7, wherein patterning the first layer comprises: patterning the first layer by a lithography process.

Clause 19. The method of any one of clauses 6-7, wherein patterning the first layer comprises: patterning the first layer by drilling the first opening in the first layer.

Clause 20. A semiconductor component comprising: a first semiconductor package comprising a memory die; and a second semiconductor package comprising a processor die and a plurality of metal pillars, wherein a first metal pillar of the plurality of metal pillars has a first section and a second section, wherein the first section of the first metal pillar has a first edge at a segment of the first metal pillar where the first section and the second section of the first metal pillar are attached, wherein the second section of the first metal pillar has a second edge at the segment of the first metal pillar where the first section and the second section of the first metal pillar are attached, and wherein the first edge is misaligned with respect to the second edge.

Clause 21. The semiconductor component of clause 20, wherein: the plurality of metal pillars electrically connects the first semiconductor package to the second semiconductor package.

Clause 22. The semiconductor component of any of clauses 20-21, wherein: the first section is formed by depositing metal in a first opening of a first photoresist layer; the second section is formed by depositing metal in a second opening of a second photoresist layer; metal is deposited in the first opening of the first photoresist layer in a first operation; and metal is deposited in the second opening of the second photoresist layer in a second operation that is discontinuous with respect to the first operation.

Clause 23. The semiconductor component of any of clauses 20-21, wherein: the first section is formed by depositing metal in a first opening of a first photoresist layer; the second section is formed by depositing metal in a second opening of a second photoresist layer; and metal is deposited in the first opening of the first photoresist layer and in the second opening of the second photoresist layer in a continuous operation.

Clause 24. An apparatus comprising: means for forming a first layer on a substrate; means for patterning the first layer to form a first opening in the first layer; means for forming a second layer on the first layer; means for patterning the second layer to form a second opening in the second layer; and means for depositing metal in the first opening and the second opening to form a metal pillar.

Clause 25. The apparatus of clause 24, further comprising: means for removing the first layer and the second layer subsequent to forming the metal pillar.

Clause 26. The apparatus of any one of clauses 24-25, wherein the means for depositing the metal comprises: means for depositing the metal in the first opening and the second opening subsequent to forming the second opening.

Clause 27. The apparatus of clause 26, wherein the means for depositing the metal further comprises: means for depositing the metal in the first opening and the second opening in a single continuous operation.

Clause 28. The apparatus of any one of clauses 24-25, wherein the means for depositing the metal comprises: means for depositing first metal in the first opening prior to forming the second layer on the first layer.

Clause 29. The apparatus of clause 28, wherein the means for depositing the metal further comprises: means for depositing the first metal in the first opening in a first operation; and means for depositing the second metal in the second opening in a second operation that is discontinuous with respect to the first operation.

Clause 30. The apparatus of any one of clauses 24-25, wherein: the metal pillar has a first height; and the first layer has a height that is about half the height of the metal pillar.

Clause 31. The apparatus of clause 30, wherein: the second layer has a height that is about half the height of the metal pillar.

Clause 32. The apparatus of any one of clauses 24-31, wherein: the metal comprises copper.

Clause 33. The apparatus of any one of clauses 23-32, wherein: the first opening is substantially aligned on top of the second opening.

Clause 34. The apparatus of any one of clauses 24-33, wherein: the first layer is a first photoresist layer; and the second layer is a second photoresist layer.

Clause 35. The apparatus of any one of clauses 24-34, wherein: the first layer is a first dry film resist (DFR) layer; and the second layer is a second DFR layer.

Clause 36. The apparatus of any one of clauses 24-35, wherein patterning the first layer comprises: patterning the first layer by a lithography process.

Clause 37. The apparatus of any one of clauses 24-35, wherein patterning the first layer comprises: patterning the first layer by drilling the first opening in the first layer.

Clause 38. An apparatus comprising: a substrate; and a metal pillar formed on the substrate, the metal pillar comprising a first section and a second section, wherein the first section of the metal pillar is formed by depositing metal in a first opening of a first photoresist layer, and wherein the second section of the metal pillar is formed by depositing metal in a second opening of a second photoresist layer.

Clause 39. The apparatus of clause 38, wherein: the first opening is substantially aligned with the second opening.

Clause 40. The apparatus of any of clauses 38-39, wherein: metal is deposited in the first opening of the first photoresist layer in a first operation; and metal is deposited in the second opening of the second photoresist layer in a second operation that is discontinuous with respect to the first operation.

Clause 41. The apparatus of any of clauses 38-39, wherein: metal is deposited in the first opening of the first photoresist layer and in the second opening of the second photoresist layer in a continuous operation.

Clause 42. The apparatus of any of clauses 38-41, wherein: the metal pillar comprises a copper pillar or a copper post.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. A method comprising:
forming a first dry film resist layer on a substrate;
patterning the first dry film resist layer to form a first opening in the first dry film resist layer, wherein the first opening exposes a surface of the substrate;
forming, prior to forming a metal in the first opening, a second dry film resist layer on the first dry film resist layer and over the first opening in the first dry film resist layer, wherein the first opening comprises an unfilled opening between the exposed surface of the substrate and a bottom surface of the second dry film resist layer;
patterning the second dry film resist layer to form a second opening in the second dry film resist layer, wherein the second opening is aligned over the first opening;
depositing a metal on the exposed surface, in the first opening and in the second opening to form a metal pillar; and
removing the first dry film resist layer and the second dry film resist layer.

2. The method of claim 1, wherein the substrate comprises a printed circuit board and the exposed surface of the substrate comprises a surface of an interconnect structure.

3. The method of claim 1, wherein forming the second dry film resist layer comprises laminating the second dry film resist layer on the first dry film resist layer and over the first opening in the first dry film resist layer.

4. The method of claim 3, wherein depositing the metal comprises depositing the metal in the first opening and the second opening in a single continuous operation.

5. The method of claim 1, wherein removing the first dry film resist layer and the second dry film resist layer comprises at least one of peeling, treating with chemicals and/or heat, or exposing to a laser.

6. The method of claim 1, wherein:
the metal pillar has a first height; and
the first dry film resist layer has a height that is about half the height of the metal pillar.

7. The method of claim 6, wherein:
the second dry film resist layer has a height that is about half the height of the metal pillar.

8. A method comprising:
forming a first dry film resist layer on a substrate;
patterning the first dry film resist layer to form a first opening in the first dry film resist layer, wherein the first opening exposes a surface of the substrate;
forming a second dry film resist layer on the first dry film resist layer and over the first opening in the first dry film resist layer, wherein the first opening is between the surface of the substrate and a bottom surface of the second dry film resist layer;
patterning the second dry film resist layer to form a second opening in the second dry film resist layer, wherein the second opening is aligned over the first opening;
forming, prior to depositing a metal, a third dry film resist layer on the second dry film resist layer and over the second opening in the second dry film resist layer, wherein the first and second openings are between the surface of the substrate and a bottom surface of the third dry film resist film;
patterning the third dry film resist layer to form a third opening in the third dry film resist layer, wherein the third opening is aligned over the first and second openings;
depositing a metal in the first opening, the second opening, and the third opening to form a metal pillar; and
removing the first dry film resist layer, the second dry film resist layer, and the third dry film resist layer, wherein removing the first dry film resist layer, the second dry film resist layer, and the third dry film resist layer comprises at least one of peeling, treating with chemicals and/or heat, or exposure to a laser.

9. The method of claim 8, wherein the substrate comprises a printed circuit board and the exposed surface of the substrate comprises a surface of an interconnect structure.

10. The method of claim 8, wherein forming the second dry film resist layer comprises laminating the second dry film resist layer on the first dry film resist layer and over the first opening in the first dry film resist layer.

11. The method of claim 10, wherein depositing the metal comprises depositing the metal in the first opening and the second opening in a single continuous operation.

12. The method of claim 8, wherein:
the metal pillar has a first height; and
the first dry film resist layer has a height that is about half the height of the metal pillar.

13. The method of claim 12, wherein:
the second dry film resist layer has a height that is about half the height of the metal pillar.

14. A method comprising:
forming a first dry film resist layer on a substrate;
patterning the first dry film resist layer to form a first opening in the first dry film resist layer, wherein the first opening exposes a surface of the substrate;
forming a second dry film resist layer on the first dry film resist layer and over the first opening in the first dry film resist layer, wherein the first opening is between the surface of the substrate and a bottom surface of the second dry film resist layer;
patterning the second dry film resist layer to form a second opening in the second dry film resist layer, wherein the second opening is aligned over the first opening;
forming, prior to depositing a metal in the first or second openings, a third dry film resist layer on the second dry film resist layer and over the second opening in the second dry film resist layer, wherein the first and second openings are between the surface of the substrate and a bottom surface of the third dry film resist film;
patterning the third dry film resist layer to form a third opening in the third dry film resist layer, wherein the third opening is aligned over the first and second openings;
depositing a metal in the first opening, the second opening, and the third opening to form a metal pillar; and
removing the first, second, and third dry film resist layers.

15. The method of claim 14, wherein the substrate comprises a printed circuit board and the exposed surface of the substrate comprises a surface of an interconnect structure.

16. The method of claim 14, wherein forming the second dry film resist layer comprises laminating the second dry film resist layer on the first dry film resist layer and over the first opening in the first dry film resist layer.

17. The method of claim 16, wherein depositing the metal comprises depositing the metal in the first, second, and third openings in a single continuous operation.

18. The method of claim 14, wherein:
the metal pillar has a first height; and
the first dry film resist layer has a height that is about half the height of the metal pillar.

19. The method of claim 18, wherein:
the second dry film resist layer has a height that is about half the height of the metal pillar.

\* \* \* \* \*